(12) United States Patent
Nishimura et al.

(10) Patent No.: US 9,052,096 B2
(45) Date of Patent: Jun. 9, 2015

(54) LIGHT EXTRACTION TRANSPARENT SUBSTRATE FOR ORGANIC EL ELEMENT, AND ORGANIC EL ELEMENT USING THE SAME

(75) Inventors: Suzushi Nishimura, Tokyo (JP); Soon Moon Jeong, Tokyo (JP); Maki Fukuda, Tokyo (JP); Toshihiko Shibanuma, Tokyo (JP)

(73) Assignee: JX Nippon Oil & Energy Corporation, Tokyo (JP)

( * ) Notice: Subject to any disclaimer, the term of this patent is extended or adjusted under 35 U.S.C. 154(b) by 0 days.

(21) Appl. No.: 14/114,175

(22) PCT Filed: Apr. 25, 2012

(86) PCT No.: PCT/JP2012/061022
§ 371 (c)(1),
(2), (4) Date: Oct. 25, 2013

(87) PCT Pub. No.: WO2012/147759
PCT Pub. Date: Nov. 1, 2012

(65) Prior Publication Data
US 2014/0042426 A1 Feb. 13, 2014

(30) Foreign Application Priority Data
Apr. 27, 2011 (JP) ................................ 2011-099542

(51) Int. Cl.
*H01L 51/52* (2006.01)
*F21V 13/10* (2006.01)
*B82Y 20/00* (2011.01)

(52) U.S. Cl.
CPC ............ *F21V 13/10* (2013.01); *H01L 51/5275* (2013.01); *B82Y 20/00* (2013.01); *H01L 51/52* (2013.01); *Y10S 977/834* (2013.01)

(58) Field of Classification Search
CPC ....................................................... F21V 13/10
See application file for complete search history.

(56) References Cited

U.S. PATENT DOCUMENTS 6,570,324 B1 * 5/2003 Tutt et al. ...................... 313/500
7,736,551 B2 6/2010 Okayasu
(Continued)

FOREIGN PATENT DOCUMENTS

JP  2008279597 A  11/2008
JP  2009-21089 A  1/2009
(Continued)

OTHER PUBLICATIONS

International Search Report dated Aug. 7, 2012, issued in International Application PCT/JP2012/061022.
(Continued)

*Primary Examiner* — Stephen W Smoot
(74) *Attorney, Agent, or Firm* — Fitch, Even, Tabin & Flannery LLP

(57) ABSTRACT

A light extraction transparent substrate for an organic EL element includes a transparent supporting substrate; a diffraction grating having a first concavity and convexity layer having first concavities and convexities formed on a surface thereof, which is located on a surface of the transparent supporting substrate, and a microlens having a second concavity and convexity layer having second concavities and convexities formed on a surface thereof, which is located on a surface of the transparent supporting substrate. When a Fourier-transformed image is obtained by performing two-dimensional fast Fourier transform processing on a concavity and convexity analysis image obtained by analyzing the shape of each of the first and second concavities and convexities by use of an atomic force microscope, the Fourier-transformed image shows a circular or annular pattern substantially centered at an origin at which an absolute value of wavenumber is 0 $\mu m^{-1}$.

10 Claims, 8 Drawing Sheets

(56) References Cited

U.S. PATENT DOCUMENTS

| | | |
|---|---|---|
| 8,541,778 B2 | 9/2013 | Seki et al. |
| 2007/0273972 A1 | 11/2007 | Okayasu |
| 2010/0213627 A1 | 8/2010 | Okayasu |
| 2011/0050082 A1 | 3/2011 | Inoue et al. |
| 2011/0233570 A1* | 9/2011 | Lee et al. .................. 257/88 |
| 2011/0278548 A1 | 11/2011 | Takezoe et al. |
| 2012/0132897 A1 | 5/2012 | Seki et al. |
| 2013/0186467 A1 | 7/2013 | Saeki et al. |

FOREIGN PATENT DOCUMENTS

| | | |
|---|---|---|
| JP | 2009032463 A | 2/2009 |
| JP | 2011-243308 A | 12/2011 |
| JP | 2012-28307 A | 2/2012 |
| WO | 2009/131019 A1 | 10/2009 |
| WO | 2011/007878 A1 | 1/2011 |
| WO | 2011007878 A1 | 1/2011 |
| WO | 2012/043828 A1 | 4/2012 |
| WO | 2012/096368 A1 | 7/2012 |

OTHER PUBLICATIONS

The 57th Meeting of the Japan Society of Applied Physics and Related Societies, Mar. 17-20, 2010, Tokai University, Hiratsuka-shi, Kanagawa Japan (including English translation).

Takezoe et al., "Enhanced Light Extraction Efficiency of Organic Light Emitting Diode Using Microlens" Tokyo Institute of Technology, presentation data used for the 57th Spring Meeting, 2010.

International Preliminary Report on Patentability issued against International Application No. PCT/JP2012/061022, issued Nov. 26, 2013.

Office Action issued by the Japan Patent Office dated Sep. 26, 2014 Japanese Application No. JP2013-512385.

* cited by examiner

US 9,052,096 B2

LIGHT EXTRACTION TRANSPARENT SUBSTRATE FOR ORGANIC EL ELEMENT, AND ORGANIC EL ELEMENT USING THE SAME

CROSS-REFERENCE TO RELATED APPLICATIONS

This Application is a U.S. National Stage Application filed under 35 U.S.C. §371 of International Application PCT/JP2012/061022, filed Apr. 25, 2012, designating the United States, which claims priority from Japanese Patent Application 2011-099542, filed Apr. 27, 2011, the complete disclosures of which are hereby incorporated herein by reference in their entirety for all purposes.

TECHNICAL FIELD

The present invention relates to a light extraction transparent substrate for an organic EL element, and an organic EL element using the same.

BACKGROUND ART

Organic electroluminescence elements (organic EL elements) have been used as self-luminous elements for image display devices such as displays, and for surface light sources. Such an organic EL element (Organic Light Emitting Diode: OLED) is generally fabricated by stacking a transparent electrode serving as an anode, an organic layer, and a metal electrode serving as a cathode in this order on a transparent supporting substrate such as a glass substrate or a transparent plastic film. Thus, upon application of a voltage between the transparent electrode and the metal electrode, electrons supplied from the cathode and holes supplied from the anode are recombined at the organic layer. Then, when excitons generated by the recombination change from an excited state to a ground state, EL emission occurs. Light of the EL emission goes through the transparent electrode, and is extracted to the outside on the transparent supporting substrate side.

However, such an organic EL element has a problem that the light generated at the organic layer cannot be extracted to the outside sufficiently. Specifically, the problem is that a large proportion of the light generated at the organic layer disappears as heat during repetition of multiple reflections in the element, or propagates inside the element and exits from end portions of the element, so that a sufficient external extraction efficiency cannot be achieved.

To solve the problem, for example, International Publication No. WO2011/007878 (WO2011/007878: PTL 1) discloses an organic EL element comprising: a transparent supporting substrate (A); a cured resin layer (B) staked on the transparent supporting substrate; and a transparent electrode (C), an organic layer (D), and a metal electrode (E), which are stacked in this order on the cured resin layer (B), wherein the cured resin layer (B) has concavities and convexities on a surface thereof, and a shape of the concavities and convexities is such that when a Fourier-transformed image is obtained by performing two-dimensional fast Fourier transform processing on a concavity and convexity analysis image obtained by analyzing the shape of the concavities and convexities by use of an atomic force microscope, the Fourier-transformed image shows a circular or annular pattern substantially centered at an origin at which an absolute value of wavenumber is 0 µm$^{-1}$, and the circular or annular pattern is present within a region where an absolute value of wavenumber is within a range of 10 µm$^{-1}$ or less. In addition, Hideo Takezoe et al., "Enhanced Light Extraction Efficiency of Organic Light Emitting Diode using Microlens based on Buckling Phenomenon" described on p. 12-345 of "Proceedings (NPL 1)" of The 57th Meeting of The Japan Society of Applied Physics and Related Societies issued in 2010 discloses that an ultraviolet-cured resin having a concavity and convexity shape is formed by a nanoimprinting method using a polydimethylsiloxane (PDMS) in which a concavity and convexity shape is formed by a buckling phenomenon, and this ultraviolet-cured resin is used as a microlens for an organic EL element.

The organic EL element described in PTL 1 and the organic EL element using the microlens described in NPL 1 have sufficiently high light extraction efficiencies. However, there is a demand for development of an organic EL element whose angle-dependence of luminance and change in chromaticity are sufficiently reduced at higher levels.

CITATION LIST

Patent Literature

[PTL 1] International Publication No. WO2011/007878

Non Patent Literature

[NPL 1] Hideo Takezoe et al., "Enhanced Light Extraction Efficiency of Organic Light Emitting Diode using Microlens based on Buckling Phenomenon," "Proceedings (NPL 1)" of The 57th Meeting of The Japan Society of Applied Physics and Related Societies, issued in 2010, p. 12-345.

SUMMARY OF INVENTION

Technical Problem

The present invention has been made in view of the problems of the above-described conventional techniques, and an object of the present invention is to provide a light extraction transparent substrate for an organic EL element, the light extraction transparent substrate being capable of sufficiently improving the light extraction efficiency of an organic EL element, sufficiently reducing the change in chromaticity, and sufficiently reducing the angle-dependence of luminance, and to provide an organic EL element using the same.

Solution to Problem

The present inventors have conducted earnest study to achieve the above-described object. As a result, the present inventors have found that, surprisingly, the use of the following transparent substrate as a transparent substrate used by being disposed on an emitting surface side of light in an organic EL element makes it possible to sufficiently improve the light extraction efficiency of the organic EL element, sufficiently reduce the change in chromaticity, and sufficiently reduce the angle-dependence of luminance, so that the above-described object can be achieved. Here, the transparent substrate comprises: a diffraction grating which comprises a first concavity and convexity layer having first concavities and convexities formed on a surface thereof and which is located on a surface of the transparent supporting substrate, the surface serving as an incident surface of the light of the organic EL element when the transparent supporting substrate is used in the organic EL element; and a microlens which comprises a second concavity and convexity layer having second concavities and convexities formed on a surface thereof and which is located on a surface of the transparent supporting substrate, the surface serving as an emitting surface of the light of the organic EL element when the transparent supporting substrate is used in the organic EL element, wherein a shape of the first concavities and convexities and a shape of the second concavities and convexities are each such that when a Fourier-transformed image is obtained by performing two-dimensional fast Fourier transform processing on a concavity and convexity analysis image obtained by analyzing the shape of the concavities and convexities by use of an atomic force microscope, the Fourier-transformed image shows a circular or annular pattern substantially centered at an origin at which an absolute value of wavenumber is 0 µm$^{-1}$. This finding has led to the completion of the present invention.

Specifically, a light extraction transparent substrate for an organic EL element of the present invention is a light extraction transparent substrate for an organic EL element, which is used by being disposed on an emitting surface side of light in the organic EL element, the light extraction transparent substrate comprising:

a transparent supporting substrate;

a diffraction grating which comprises a first concavity and convexity layer having first concavities and convexities formed on a surface thereof and which is located on a surface of the transparent supporting substrate, the surface serving as an incident surface of the light of the organic EL element when the transparent supporting substrate is used in the organic EL element; and a microlens which comprises a second concavity and convexity layer having second concavities and convexities formed on a surface thereof and which is located on a surface of the transparent supporting substrate, the surface serving as an emitting surface of the light of the organic EL element when the transparent supporting substrate is used in the organic EL element, wherein a shape of the first concavities and convexities and a shape of the second concavities and convexities are each such that when a Fourier-transformed image is obtained by performing two-dimensional fast Fourier transform processing on a concavity and convexity analysis image obtained by analyzing the shape of the concavities and convexities by use of an atomic force microscope, the Fourier-transformed image shows a circular or annular pattern substantially centered at an origin at which an absolute value of wavenumber is 0 µm$^{-1}$.

In the light extraction transparent substrate for an organic EL element of the present invention, the circular or annular pattern of the Fourier-transformed image of the shape of the first concavities and convexities is preferably present within a region where an absolute value of wavenumber is within a range of 10 µm$^{-1}$ or less, and the circular or annular pattern of the Fourier-transformed image of the shape of the second concavities and convexities is preferably present within a region where an absolute value of wavenumber is within a range of 1 µm$^{-1}$ or less.

In the above-described light extraction transparent substrate for an organic EL element of the present invention, the first concavities and convexities preferably have an average height of 30 to 100 nm and an average pitch of 10 to 700 nm, and the second concavities and convexities preferably have an average height of 400 to 1000 nm and an average pitch of 2 to 10 µm.

Moreover, in the above-described light extraction transparent substrate for an organic EL element of the present invention, an average value and a median of a depth distribution of the first concavities and convexities preferably satisfy a condition represented by the following inequality (1):

$$0.95 \times Y \leq M \leq 1.05 \times Y \quad (1)$$

[in the inequality (1), Y represents a value obtained by calculation according to a formula: Y=1.07 m−2.25 (in the formula, m represents the average value of the depth distribution of the concavities and convexities, which has a numeric value of 20 to 100 nm), and M represents the median of the depth distribution of the concavities and convexities].

Moreover, in the above-described light extraction transparent substrate for an organic EL element of the present invention, a kurtosis of the first concavities and convexities preferably has a value of −1.2 or greater, and more preferably a value within a range from −1.2 to 1.2.

In addition, the above-described light extraction transparent substrate for an organic EL element of the present invention is preferably such that when intensities of emission spectra are measured for a randomly selected measuring point on the surface of the second concavity and convexity layer on which the concavities and convexities are formed, where light incident on the light extraction transparent substrate on the first concavity and convexity layer side exits from the light extraction transparent substrate on the second concavity and convexity layer side, a condition represented by the following inequality (2) is satisfied:

$$\Sigma(y(\theta)-y_0(\theta))^2 \leq 0.05 \quad (2)$$

[in the formula, θ represents 33 measuring angles ranging from −80° to 80° with intervals of 5°, y(θ) represents values obtained by normalizing values of intensities of emission spectra measured at angles θ with respect to a value of an intensity of an emission spectrum measured at an angle of 0°, and y$_0$(θ) represents values obtained by normalizing theoretical values, determined from a radiation pattern based on the Lambert law, of intensities of emission spectra at the angles θ with respect to a theoretical value, determined from the radiation pattern, of an intensity of an emission spectrum at an angle of 0°].

In addition, in the above-described light extraction transparent substrate for an organic EL element of the present invention, the second concavity and convexity layer is preferably stacked on the transparent supporting substrate with a pressure-sensitive adhesive layer and/or an adhesive layer interposed therebetween.

Moreover, in the above-described light extraction transparent substrate for an organic EL element of the present invention, a protective layer is preferably stacked on the surface of the second concavity and convexity layer on which the shape of the concavities and convexities is formed.

Furthermore, an organic EL element of the present invention comprises:

a transparent supporting substrate;

a diffraction grating comprising a first concavity and convexity layer which is disposed on one surface of the transparent supporting substrate and which has first concavities and convexities formed on a surface thereof;

a microlens comprising a second concavity and convexity layer which is disposed on another surface of the transparent supporting substrate and which has second concavities and convexities formed on a surface thereof; and a transparent electrode, an organic layer, and a metal electrode, which are stacked in this order on the first concavity and convexity layer, while being formed into such shapes that a shape of the first concavities and convexities formed on the surface of the first concavity and convexity layer is maintained, wherein a constituent unit formed by the transparent supporting substrate, the diffraction grating, and the microlens comprises the above-described light extraction transparent substrate for an organic EL element of the present invention.

Advantageous Effects of Invention

The present invention makes it possible to provide a light extraction transparent substrate for an organic EL element, the light extraction transparent substrate being capable of sufficiently improving the light extraction efficiency of an organic EL element, sufficiently reducing the change in chromaticity, and sufficiently reducing the angle-dependence of luminance. The present invention also makes it possible to provide an organic EL element using the same.

DESCRIPTION OF EMBODIMENTS

Figure 1:
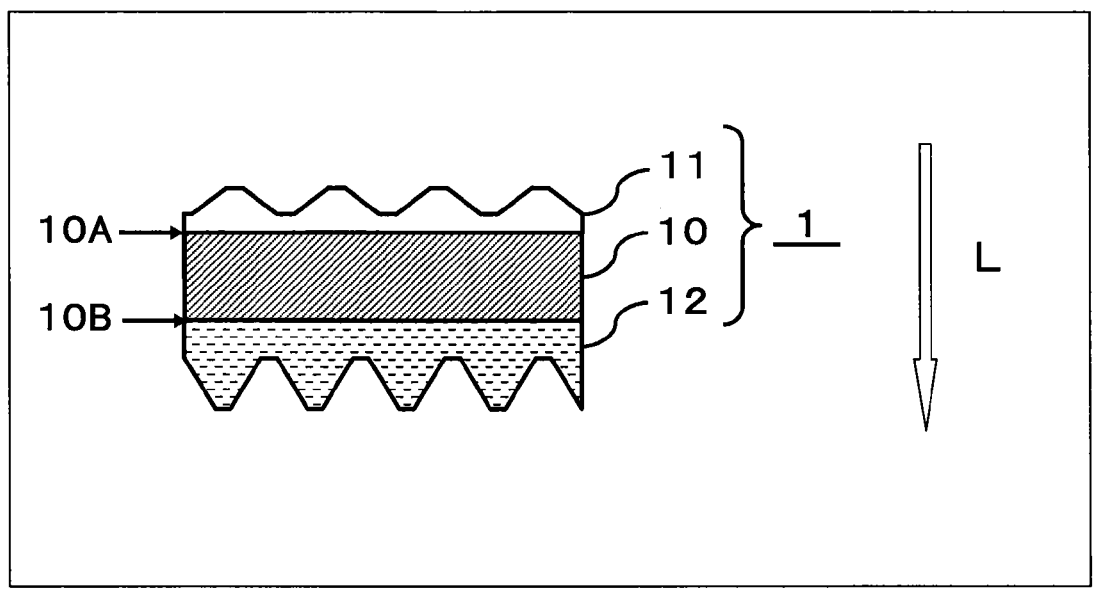
FIG. 1 is a cross-sectional view schematically showing a preferred embodiment of a light extraction transparent substrate for an organic EL element of the present invention.

Hereinafter, preferred embodiments of the present invention will be described in detail with reference to the drawings. Note that, in the following description and drawings, the same or equivalent elements are denoted by the same reference numerals, and overlapping descriptions thereof are omitted.

(Light Extraction Transparent Substrate for Organic EL Element)

A light extraction transparent substrate for an organic EL element of the present invention is a light extraction transparent substrate for an organic EL element, which is used by being disposed on an emitting surface side of light in the organic EL element, the light extraction transparent substrate comprising:

a transparent supporting substrate;

a diffraction grating which comprises a first concavity and convexity layer having first concavities and convexities formed on a surface thereof and which is located on a surface of the transparent supporting substrate, the surface serving as an incident surface of the light of the organic EL element when the transparent supporting substrate is used in the organic EL element; and a microlens which comprises a second concavity and convexity layer having second concavities and convexities formed on a surface thereof and which is located on a surface of the transparent supporting substrate, the surface serving as an emitting surface of the light of the organic EL element when the transparent supporting substrate is used in the organic EL element, wherein a shape of the first concavities and convexities and a shape of the second concavities and convexities are each such that when a Fourier-transformed image is obtained by performing two-dimensional fast Fourier transform processing on a concavity and convexity analysis image obtained by analyzing the shape of the concavities and convexities by use of an atomic force microscope, the Fourier-transformed image shows a circular or annular pattern substantially centered at an origin at which an absolute value of wavenumber is 0 $\mu m^{-1}$.

FIG. 1 is a cross-sectional view schematically showing a preferred embodiment of the light extraction transparent substrate for an organic EL element of the present invention. A light extraction transparent substrate 1 shown in FIG. 1 comprises a transparent supporting substrate 10, a diffraction grating 11, and a microlens 12. Note that the arrow L in FIG. 1 conceptually indicates a direction in which light from the inside of an organic EL element travels, when the light extraction transparent substrate is used in the organic EL element, and the organic EL element is caused to emit light.

<Transparent Supporting Substrate 10>

The transparent supporting substrate 10 is not particularly limited, and a known transparent substrate usable for an organic EL element can be used as appropriate. Examples of the transparent substrate include substrates made of a transparent inorganic material such as glass; substrates made of a resin such as polyethylene terephthalate (PET), polyethylene terenaphthalate (PEN), polycarbonate (PC), cycloolefin polymer (COP), polymethyl methacrylate (PMMA), or polystyrene (PS); stacked substrates having a gas barrier layer made of an inorganic substance such as SiN, $SiO_2$, SiC, $SiO_xN_y$, $TiO_2$, or $Al_2O_3$ formed on a surface of a substrate made of any of the above-described resins; and stacked substrates having substrates made of any of the above-described resins and gas barrier layers made of any of the above-described inorganic substances stacked alternately on each other. In addition, the thickness of the transparent supporting substrate 10 is preferably within a range from 1 to 500 µm.

<Diffraction Grating 11>

The diffraction grating 11 is a layer (first concavity and convexity layer) having first concavities and convexities formed on a surface thereof. Examples of a material (diffraction grating formation material) for forming the diffraction grating (first concavity and convexity layer) 11 include resin materials (materials made of curable resins) such as epoxy resin, acrylic resin, urethane resin, melamine resin, urea resin, polyester resin, phenolic resin, and cross-linking type liquid crystal resin; transparent inorganic layer formation materials (for example, a sol containing a metal material such as a metal alkoxide, in a case where a transparent inorganic layer is formed by forming a concavity and convexity layer by the sol-gel process); and the like. As described above, the diffraction grating (concavity and convexity layer) 11 may be a cured resin layer obtained by curing the resin material, or an inorganic layer formed by using the transparent inorganic layer formation material. The diffraction grating 11 is preferably an inorganic layer from the viewpoint that a layer having higher characteristics in heat resistance, mechanical strength, and the like can be obtained. In addition, the thickness of the first concavity and convexity layer is preferably within a range from 0.01 to 500 µm (more preferably 0.5 to 500 µm). If the thickness of the first concavity and convexity layer is less than the lower limit, heights of the concavities and convexities formed on the surface of the first concavity and convexity layer tend to be insufficient. Meanwhile, if the thickness of the first concavity and convexity layer exceeds the upper limit, an effect of volume change of the diffraction grating formation material (for example, a resin) which occurs upon curing tends to be so large that the formation of the concavity and convexity shape tends to be poor.

The diffraction grating 11 needs to be such that when a Fourier-transformed image is obtained by performing two-dimensional fast Fourier transform processing on a concavity and convexity analysis image obtained by analyzing the shape of the first concavities and convexities formed on the surface of the first concavity and convexity layer by use of an atomic force microscope, the Fourier-transformed image shows a circular or annular pattern substantially centered at an origin at which an absolute value of wavenumber is 0 $\mu m^{-1}$. By forming the shape of the first concavities and convexities on the surface of the concavity and convexity layer so that the Fourier-transformed image can satisfy the above-described requirement, a diffraction grating having a sufficiently low wavelength dependence and a sufficiently low directivity can be obtained.

In addition, the circular or annular pattern of the Fourier-transformed image of the shape of the first concavities and convexities is preferably present within a region where an absolute value of wavenumber is within a range of 10 $\mu m^{-1}$ or less. By forming the shape of the concavities and convexities on the surface of the concavity and convexity layer so that the Fourier-transformed image can satisfy the above-described requirement, it tends to be possible to reduce the wavelength dependence and the directivity of the diffraction grating at higher levels.

In addition, the pattern of the Fourier-transformed image is more preferably annular, from the viewpoint that more advanced effects on wavelength dependence and directivity can be obtained. In addition, similarly from the viewpoint that more advanced effects on wavelength dependence and directivity can be obtained, the circular or annular pattern of the Fourier-transformed image is more preferably present within a region where an absolute value of wavenumber is within a range from 1.25 to 10 $\mu m^{-1}$ (further preferably 1.25 to 5 $\mu m^{-1}$).

Note that "the circular or annular pattern of the Fourier-transformed image" herein is a pattern observed when bright spots in the Fourier-transformed image gather. Hence, the term "circular" herein means that the pattern of the gathering of the bright spots looks like a substantially circular shape, and is a concept also including a case where part of a contour looks like a convex shape or a concave shape. Meanwhile, the term "annular" means that the pattern of the gathering of the bright spots looks like a substantially annular shape, and is a concept also including a case where a shape of an outer circle or an inner circle of the ring looks like a substantially circular shape and further including a case where part of the contours of the outer circle and/or the inner circle of the ring looks like a convex shape or a concave shape.

Meanwhile, the phrase "the circular or annular pattern is present within a region where an absolute value of wavenumber is within a range of 10 $\mu m^{-1}$ or less (preferably 1.25 to 10 $\mu m^{-1}$, and further preferably 1.25 to 5 $\mu m^{-1}$)" herein means that 30% or more (more preferably 50% or more, furthermore preferably 80% or more, and particularly preferably 90% or more) of bright spots constituting the Fourier-trans formed image are present within a region where an absolute value of wavenumber is within a range of 10 $\mu m^{-1}$ or less (preferably 1.25 to 10 $\mu m^{-1}$, and further preferably 1.25 to 5 $\mu m^{-1}$).

The Fourier-transformed image can be obtained by analyzing the shape of the concavities and convexities formed on the surface of the concavity and convexity layer by use of an atomic force microscope, thereby obtaining a concavity and convexity analysis image, and then performing two-dimensional fast Fourier transform processing on the concavity and convexity analysis image.

In addition, the concavity and convexity analysis image can be obtained by analysis using an atomic force microscope under the following analysis conditions:
Measurement mode: cantilever intermittent contact mode,
Material of cantilever: silicon,
Lever width of cantilever: 40 µm,
Diameter of tip of cantilever chip: 10 nm.

As the atomic force microscope, commercially available ones can be used as appropriate. For example, a scanning probe microscope equipped with an environment control unit "Nanonavi II Station/E-sweep" manufactured by SII Nano-Technology Inc. can be used. In addition, it is preferable to employ a cantilever intermittent contact mode as the measurement mode of the atomic force micros cope. In this respect, when the scanning probe microscope equipped with an environment control unit manufactured by SII NanoTechnology Inc. is used, the dynamic force mode (DMF mode) can be used. Moreover, as the cantilever, one whose material is silicon, lever width is 40 µm, and diameter of a tip of a cantilever chip is 10 nm is preferably used, and SI-DF40 can be used, for example. In addition, when the analysis is conducted by use of an atomic force microscope, it is preferable to observe the shape of the concavities and convexities formed on the surface of the concavity and convexity layer in the air at a temperature of 25° C.

The two-dimensional fast Fourier transform processing on the concavity and convexity analysis image can be easily performed by electronic image processing using a computer equipped with software for two-dimensional fast Fourier trans form processing. In the two-dimensional fast Fourier transform processing, a flattening process including primary inclination correction is preferably performed on the concavity and convexity analysis image. Note that a concavity and convexity analysis image displaying an area of 3 μm square (length: 3 μm, width: 3 μm) can be used as the concavity and convexity analysis image on which the two-dimensional fast Fourier transform processing is performed.

In addition, in the diffraction grating 11, an average height of the first concavities and convexities formed on the surface of the first concavity and convexity layer is preferably 20 to 100 nm, more preferably 30 to 100 nm, and further preferably 40 to 80 nm. If the average height of the first concavities and convexities is less than the lower limit, the height is so small relative to the wavelengths of the visible light that necessary diffraction tends not to occur. Meanwhile, suppose a case where the average height exceeds the upper limit. In such a case, when the obtained diffraction grating is used as an optical element on the light extraction port side of an organic EL element, not only destruction and life-shortening of the element tend to occur because of heat generation which occurs when the electric field distribution inside the EL layer becomes nonuniform, and hence electric fields concentrate on a certain position, but also replication of the concavities and convexities by nanoimprinting tends to be difficult. Note that the average height of the first concavities and convexities refers to an average value of heights of the concavities and convexities, where the heights of the concavities and convexities (distances between concave portions and convex portions in the depth direction) on the surface of the first concavity and convexity layer are measured. In addition, a value calculated as follows is employed as the average value of the heights of the concavities and convexities. Specifically, a concavity and convexity analysis image is obtained by measuring the shape of the concavities and convexities on the surface in a randomly selected measuring region (preferably a randomly selected measuring region of 3 μm square) by use of a scanning probe microscope (for example, one manufactured by SII NanoTechnology Inc. under the product name of "E-sweep," or the like) Then, distances between randomly selected concave portions and convex portions in the depth direction are measured at 100 points or more in the concavity and convexity analysis image, and the average of the distances is determined.

An average pitch of the first concavities and convexities formed on the surface of the first concavity and convexity layer is preferably within a range from 10 to 700 nm, and more preferably within a range from 100 to 700 nm. If the average pitch of the first concavities and convexities is less than the lower limit, the pitch is so small relative to wavelengths of the visible light that necessary diffraction tends not to occur. Meanwhile, if the average pitch exceeds the upper limit, the diffraction angle becomes so small that the functions as a diffraction grating tend to be lost. Note that the average pitch of the first concavities and convexities refers to an average value of pitches of the first concavities and convexities, where pitches of the first concavities and convexities on the surface of the first concavity and convexity layer (distances between adjacent convex portions or between adjacent concave portions) are measured. In addition, a value which can be calculated as follows is employed as the average value of pitches of the first concavities and convexities. Specifically, a concavity and convexity analysis image is obtained by analyzing the concavities and convexities on the surface by use of a scanning probe microscope (for example, one manufactured by SII NanoTechnology Inc. under the product name of "E-sweep," or the like) under the above-described analysis conditions. Then, distances between randomly selected adjacent convex portions or between randomly selected adjacent concave portions are measured at 100 points or more in the concavity and convexity analysis image, and the average of these distances is determined. Moreover, the pitches of the concavities and convexities can be easily achieved by use of a master block according to the present invention to be described later.

In addition, an average value and a median of a depth distribution of the first concavities and convexities formed on the surface of the diffraction grating 11 comprising the first concavity and convexity layer preferably satisfy a condition represented by the following inequality (1):

$$0.95 \times Y \le M \le 1.05 \times Y \tag{1}$$

[in the inequality (1), Y represents a value obtained by calculation according to a formula: Y=1.07 m−2.25 (in the formula, m represents the average value of the depth distribution of the concavities and convexities), and M represents the median of the depth distribution of the concavities and convexities]. When the median (M) and the average value (m) satisfy the above-described condition, generation of a leakage current can be suppressed sufficiently in the use for an organic EL element.

The following method is employed as a method for measuring the median (M) of the depth distribution of the concavities and convexities of the first concavity and convexity layer, and the average value (m) of the depth distribution thereof. Specifically, first, a concavity and convexity analysis image is obtained by measuring the shape of the first concavities and convexities on the surface of the first concavity and convexity layer by use of a scanning probe microscope (for example, one manufactured by SII NanoTechnology Inc. under the product name of "E-sweep," or the like). In analyzing the concavities and convexities as described above, a concavity and convexity analysis image is obtained by measurement in a randomly selected measuring region of 3 μm square (length: 3 μm, width: 3 μm) under the above-described analysis conditions. Here, data on each of the heights of the concavities and convexities are determined at 16384 (128 columns×128 rows) or more measuring points in the measuring region on the nanometer scale. Note that, although the number of the measuring points varies depending on the kind and settings of the measuring apparatus used, a measurement at 65536 (256 columns×256 rows) points (a measurement with a resolution of 256 pixels×256 pixels) can be conducted in a measuring region of 3 μm square, for example, when the above-described measuring apparatus manufactured by SII NanoTechnology Inc. under the product name of "E-sweep" is used. Then, regarding the thus measured heights (unit: nm) of the concavities and convexities, first, of all the measuring points, a measuring point is found which has the largest height from the surface of the transparent supporting substrate 10. Then, while a plane which includes the measuring point and is parallel to the surface of the transparent supporting substrate 10 is taken as a reference plane (horizontal plane), values of depths from the reference plane (the differences each obtained by subtracting the height from the transparent supporting substrate 10 at one of the measuring points from the value of the height from the transparent supporting substrate 10 at the above-described measuring point with the largest height) are determined as concavity and convexity depth data. Note that some measuring apparatuses (for example, one manufactured by SII NanoTechnology Inc. under the product name of "E-sweep") are capable of determining the concavity and convexity depth data by automatic calculation with software provided in the measuring apparatuses or the like. The values determined by such automatic calculation can be used as the concavity and convexity depth data. After the concavity and convexity depth data are determined at each measuring point as described above, the average value (m) of the depth distribution of the concavities and convexities can be determined by calculation according to the following formula (I):

[Math. 1]

$$m = \frac{1}{N}\sum_{i=1}^{N} x_i \quad (I)$$

[in the formula (I), N represents a total number of measuring points (the number of all the pixels), i represents any integer of 1 to N, $x_i$ represents the concavity and convexity depth data at the i-th measuring point, and m represents the average value of the depth distribution of the concavities and convexities].

Meanwhile, the median (M) of the depth distribution of the concavities and convexities can be determined as follows. Specifically, the concavity and convexity depth data $x_i$ at all the 1- to N-th measuring points are rearranged in ascending order, and expressed as $x_{(i)}$ (in this case, the order of the heights is as follows: $x_{(1)} < x_{(2)} < x_{(3)} < \ldots < x_{(N)}$). Then, the median (M) can be determined by calculation according to one of the following formulae (II) depending on whether N is an odd number or an even number:

[Math. 2]

$$\left.\begin{array}{l} (\text{when } N \text{ is an odd number}) \\ M = x_{((N+1)/2)} \\ (\text{when } N \text{ is an even number}) \\ M = \frac{x_{(N/2)} + x_{((N/2)+1)}}{2} \end{array}\right\} \quad (II)$$

[in the formula (II), N represents the total number of measuring points (the number of all the pixels), and M represents the median of the depth distribution of the concavities and convexities].

In addition, in the diffraction grating (first concavity and convexity layer) 11, the average value (m) of the depth distribution of the first concavities and convexities in the inequality (1) is preferably 20 to 100 nm, and more preferably 40 to 80 nm. If the average value (m) of the depth distribution is less than the lower limit, the depths of the concavities and convexities are so small that a sufficient diffraction effect cannot be obtained, leading to a tendency that the light emission efficiency is difficult to improve sufficiently. Meanwhile, if the average value (m) exceeds the upper limit, the aspect ratio of the concavities and convexities is too high. Hence, in the use for an organic EL element, not only cracks are easily formed in an electrode, but also a leakage current is more easily generated during the use, so that a case where the light emission efficiency decreases or a case where light emission does not occur at all is caused, and the life of the organic EL element tends to be shortened.

Moreover, in the diffraction grating (first concavity and convexity layer) 11, a kurtosis of the concavities and convexities formed on the surface of the first concavity and convexity layer is preferably −1.2 or more, more preferably −1.2 to 1.2, further preferably −1.2 to 1, and particularly preferably −1.1 to 0.0. If the kurtosis is less than the lower limit, it tends to be difficult to sufficiently suppress the generation of a leakage current in the use for an organic EL element. Meanwhile, if the kurtosis exceeds the upper limit, almost no concavities and convexities exist in a sectional shape of the diffraction grating (first concavity and convexity layer) 12, resulting in a state where projections or dents sparsely exist. Hence, not only the light-extraction efficiency, which is an advantage of the concavity and convexity structure, cannot be improved sufficiently (the diffraction effect cannot be obtained sufficiently), but also the electric field is more likely to be concentrated on the portions of the projections, so that leakage currents tend to be generated.

As a method for measuring the kurtosis, the following method is employed. Specifically, first, as in the case of the above-described method for measuring the median (M) of the depth distribution of the first concavities and convexities and the average value (m) of the depth distribution thereof, concavity and convexity depth data are determined at 16384 (128 columns×128 rows) or more measuring points (65536 points in a case where a measuring apparatus manufactured by SII NanoTechnology Inc. under the product name of "E-sweep" is used, for example) in a measuring region of 3 µm square. Then, the average value (m) of the depth distribution of the concavities and convexities and the standard deviation (σ) of the depth distribution of the concavities and convexities are calculated on the basis of the concavity and convexity depth data for the measuring points. Note that the average value (m) can be determined by calculation according to the above-described formula (I) as described above. Meanwhile, the standard deviation (σ) of the depth distribution can be determined by calculation according to the following formula (III):

[Math. 3]

$$\sigma = \sqrt{\frac{1}{N}\sum_{i=1}^{N}(x_i - m)^2} \quad (III)$$

[in the formula (III), N represents a total number of measuring points (the number of all the pixels), $x_i$ represents the concavity and convexity depth data at the i-th measuring point, and m represents the average value of the depth distribution of the concavities and convexities].

Subsequently, on the basis of the thus determined values of the average value (m) and the standard deviation (O), the kurtosis (k) can be determined by calculation according to the following formula (IV):

[Math. 4]

$$k = \frac{\frac{1}{N}\sum_{i=1}^{N}(x_i - m)^4}{\sigma^4} - 3 \quad (IV)$$

[in formula (IV), N represents a total number of measuring points (the number of all the pixels), $x_i$ represents the concavity and convexity depth data at the i-th measuring point, m represents the average value of the depth distribution of the concavities and convexities, and σ represents a value of the standard deviation].

Note that generation of a leakage current can be suppressed at a sufficiently higher level, when the average value (m) and the median (M) of the depth distribution of the first concavities and convexities in the first concavity and convexity layer forming the diffraction grating 11 satisfy the condition represented by the inequality (1), or when the kurtosis (k) satisfies a condition of being −1.2 or more. Although the reason for this is not exactly clear, the present inventors peculate as follows. Specifically, when the concavity and convexity structure of the diffraction grating is such that the average value (m) and the median (M) of the depth distribution of the concavities and convexities satisfy the condition represented by the inequality (1), or such that the kurtosis (k) is −1.2 or more, no extreme cusps exist in a sectional shape of the structure, irrespective of whether the heights or pitches of the concavities and convexities of the waveform and the surface shape of the waveform are regular or irregular. Hence, when an organic layer is vapor deposited onto the surface of the concavities and convexities by use of this structure for manufacturing an organic EL element, the thickness of the organic layer can be sufficiently prevented from being partially extremely small, and the organic layer can be stacked in a sufficiently uniform film thickness. As a result, the inter-electrode distance can be sufficiently uniform, so that concentration of an electric field can be suppressed sufficiently. In addition, when the condition represented by the inequality (1) or the condition that the kurtosis (k) is −1.2 or more is satisfied, the gradient of the potential distribution in inclined portions of the wave form of the concavity and convexity structure is gentle in the organic EL element. The present inventors speculate that, for this reason, the generation of a leakage current can be suppressed further sufficiently, when the diffraction grating comprising the concavity and convexity layer satisfying the condition represented by the inequality (1) or the condition that the kurtosis (k) is −1.2 or more is used for an organic EL element. Moreover, the present inventors speculate that since the generation of a leakage current can be suppressed further sufficiently as described above, the light emission efficiency is sufficiently improved, and also the life-extension of the organic EL element can be achieved. In addition, the diffraction grating 11 comprising the first concavity and convexity layer satisfying such a condition can be formed efficiently by utilizing a method for manufacturing a diffraction grating 11 to be described later.

A method for manufacturing the diffraction grating (first concavity and convexity layer) 11 is not particularly limited, and a known method capable of manufacturing a diffraction grating satisfying the above-described condition (for example, the method described in International Publication No. WO2011/007878 (WO2011/007878A1) or the like) can be employed, as appropriate. As the method for manufacturing a diffraction grating 11, it is preferable to employ a method (A) comprising: a step of applying a diffraction grating formation material (for example, a curable resin) onto a transparent supporting substrate, then curing the diffraction grating formation material with a master block for forming a diffraction grating being pressed thereto, and thereafter detaching the master block, thereby stacking, on the transparent supporting substrate, a concavity and convexity layer having concavities and convexities formed thereon, because the first concavities and convexities can be formed more efficiently. Note that the method (A) makes it possible to efficiently manufacture a concavity and convexity layer having first concavities and convexities formed thereon, which satisfy the above-described characteristics of concavities and convexities (including the conditions of the average height, the average pitch, and the like). Hereinafter, the method (A) for manufacturing a diffraction grating 11 is described.

In the method (A), a master block (mold) for forming a diffraction grating is used. The master block (mold) for forming a diffraction grating only needs to be capable of forming the first concavity and convexity layer having the first concavities and convexities formed thereon as described for the diffraction grating 11 in the following manner. Specifically, a layer made of an uncured diffraction grating formation material (for example, a curable resin) is cured with the master block (mold) being pressed thereto, and thus the first concavity and convexity layer is formed by transfer (inversion) of the shape of the concavities and convexities formed on the master block. Hence, a master block having a concavity and convexity shape on a surface thereof is used as the master block (mold) for forming a diffraction grating, and the master block (mold) preferably has characteristics of the concavity and convexity shape (average height, average pitch, and the like), which are the same as the characteristics of the concavities and convexities formed on the surface of the first concavity and convexity layer forming the diffraction grating 11.

In addition, a method for manufacturing such a master block (mold) for forming a diffraction grating is not particularly limited, and, for example, a method can be preferably employed which comprises: a step (I) of applying a block copolymer solution comprising a block copolymer and a solvent onto a surface of a base material, the block copolymer comprising first and second polymers (segments); a step (II) of drying a coating film on the base material; a step (III) of heating the dried coating film at a temperature not lower than a glass transition temperature of the block copolymer; a step (IV) of removing the second polymer (segment) by an etching treatment on the coating film subjected to the step (III), to thereby form a concavity and convexity structure on the base material; a step (V) of heating the concavity and convexity structure at a temperature not lower than a glass transition temperature of the first polymer (segment); a step (VI) of forming a seed layer on the concavity and convexity structure subjected to the step (V); a step (VII) of stacking a metal layer on the seed layer by electroforming; and a step (VIII) of peeling the base material having the concavity and convexity structure from the metal layer and the seed layer. Hereinafter, the steps (I) to (VIII) are separately described, with reference to the drawings in some cases.

<Step (I)>

The step (I) is a step of applying a block copolymer solution comprising a block copolymer and a solvent onto a surface of a base material, the block copolymer comprising first and second polymers (segments).

As the block copolymer, a copolymer having a first polymer segment made of a first homopolymer and a second polymer segment made of a second homopolymer which is different from the first homopolymer is used. The second homopolymer preferably has a solubility parameter which is higher than a solubility parameter of the first homopolymer by 0.1 to 10 $(cal/cm^3)^{1/2}$. If the difference between the solubility parameters of the first and second homopolymers is less than 0.1 $(cal/cm^3)^{1/2}$, a regular micro phase separation structure of the block copolymer is difficult to form. Meanwhile, if the difference exceeds 10 $(cal/cm^3)^{1/2}$, a uniform solution of the block copolymer is difficult to prepare.

Examples of monomers serving as raw materials of homopolymers usable as the first homopolymer or the second homopolymer include styrene, methyl styrene, propylstyrene, butylstyrene, hexylstyrene, octylstyrene, methoxystyrene, ethylene, propylene, butene, hexene, acrylonitrile, acrylamide, methyl methacrylate, ethyl methacrylate, propyl methacrylate, butyl methacrylate, hexyl methacrylate, octyl methacrylate, methyl acrylate, ethyl acrylate, propyl acrylate, butyl acrylate, hexyl acrylate, octyl acrylate, methacrylic acid, acrylic acid, hydroxyethyl methacrylate, hydroxyethyl acrylate, ethylene oxide, propylene oxide, dimethylsiloxane, lactic acid, vinylpyridine, hydroxystyrene, styrenesulfonate, isoprene, butadiene, ε-caprolactone, isopropylacrylamide, vinyl chloride, ethylene terephthalate, tetrafluoroethylene, and vinyl alcohol. Of these monomers, styrene, methyl methacrylate, ethylene oxide, butadiene, isoprene, vinylpyridine, and lactic acid are preferably used from the viewpoints that the formation of phase separation easily occurs, and that the concavities and convexities are easily formed by etching.

In addition, examples of the combination of the first homopolymer and the second homopolymer include combination of two selected from the group consisting of a styrene-based polymer (more preferably polystyrene), a poly(alkyl methacrylate) (more preferably polymethyl methacrylate), polyethylene oxide, polybutadiene, polyisoprene, polyvinylpyridine, and polylactic acid. Of these combinations, combinations of a styrene-based polymer and a poly(alkyl methacrylate), combinations of a styrene-based polymer and polyethylene oxide, combinations of a styrene-based polymer and polyisoprene, and combinations of a styrene-based polymer and polybutadiene are more preferable, and combinations of a styrene-based polymer and polymethyl methacrylate, combinations of a styrene-based polymer and polyisoprene, and combinations of a styrene-based polymer and polybutadiene are particularly preferable, from the viewpoint that the depths of the concavities and convexities formed on the block copolymer can be further increased by preferentially removing one of the homopolymers by an etching treatment. A combination of polystyrene (PS) and polymethyl methacrylate (PMMA) is more preferable.

The number average molecular weight (Mn) of the block copolymer is preferably 500000 or more, more preferably 1000000 or more, and particularly preferably 1000000 to 5000000. If the number average molecular weight is less than 500000, the average pitch of the concavities and convexities formed by the micro phase separation structure of the block copolymer is so small that the average pitch of the concavities and convexities of the obtained diffraction grating becomes insufficient. Particularly when illumination light ranging over wavelengths of the visible region has to be diffracted, the average pitch is desirably 10 to 700 nm, and in this respect the number average molecular weight (Mn) of the block copolymer is preferably 500000 or more. Meanwhile, if a block copolymer having a number average molecular weight (Mn) of 500000 or more is used, it tends to be difficult to obtain a desired concavity and convexity pattern by electroforming, unless a second heating step is conducted after the etching step.

The molecular weight distribution (Mw/Mn) of the block copolymer is preferably 1.5 or less, and more preferably 1.0 to 1.35. If the molecular weight distribution exceeds 1.5, a regular micro phase separation structure of the block copolymer is difficult to form. Note that the number average molecular weight (Mn) and the weight average molecular weight (Mw) of the block copolymer are values measured by gel permeation chromatography (GPC) and converted to molecular weights of standard polystyrene.

A volume ratio between the first polymer segment and the second polymer segment (the first polymer segment: the second polymer segment) in the block copolymer is preferably 3:7 to 7:3, and more preferably 4:6 to 6:4, for creating a lamellar structure by self-assembly. If the volume ratio is out of the above-described range, it tends to be difficult to form a concavity and convexity pattern owing to a lamellar structure.

In addition, the block copolymer solution used in the step (I) can be prepared by dissolving the block copolymer in a solvent. Examples of the solvent include aliphatic hydrocarbons such as hexane, heptane, octane, decane, and cyclohexane; aromatic hydrocarbons such as benzene, toluene, xylene, and mesitylene; ethers such as diethyl ether, tetrahydrofuran, and dioxane; ketones such as acetone, methyl ethyl ketone, isophorone, and cyclohexanone; ether alcohols such as butoxyethyl ether, hexyloxyethyl alcohol, methoxy-2-propanol, and benzyloxyethanol; glycol ethers such as ethylene glycol dimethyl ether, diethylene glycol dimethyl ether, triglyme, propylene glycol monomethyl ether, and propylene glycol monomethyl ether acetate; esters such as ethyl acetate, ethyl lactate, and γ-butyrolactone; phenols such as phenol and chlorophenol; amides such as N,N-dimethylformamide, N,N-dimethylacetamide, and N-methylpyrrolidone; halogen-containing solvents such as chloroform, methylene chloride, tetrachloroethane, monochlorobenzene, and dichlorobenzene; hetero element-containing compounds such as carbon disulfide; and mixture solvents thereof. A percentage content of the block copolymer in the block copolymer solution is preferably 0.1 to 15% by mass, and more preferably 0.3 to 5% by mass, relative to 100% by mass of the block copolymer solution.

In addition, the block copolymer solution may further comprise a different homopolymer (a homopolymer other than the first homopolymer and the second homopolymer in the block copolymer contained in the solution: for example, when the combination of the first homopolymer and the second homopolymer in the block copolymer is a combination of polystyrene and polymethyl methacrylate, the different homopolymer may be any kind of homopolymer other than polystyrene and polymethyl methacrylate), a surfactant, an ionic compound, an anti-foaming agent, a leveling agent, and the like.

By adding the different homopolymer to the block copolymer solution, it is possible to change the shape (for example, the depths of the concavities and convexities, and the like) of the micro phase separation structure formed by the block copolymer. For example, a polyalkylene oxide can be used to increase the depths of the concavities and convexities formed by the micro phase separation structure. As the polyalkylene oxide, polyethylene oxide or polypropylene oxide is more preferable, and polyethylene oxide is particularly preferable. In addition, as the polyethylene oxide, one represented by the following formula is preferable:

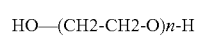

HO—(CH2-CH2-O)$n$-H

[in the formula, n represents an integer of 10 to 5000 (more preferably an integer of 50 to 1000, and further preferably an integer of 50 to 500)].

If the value of n is less than the lower limit, the molecular weight is so low that the above-described effect achieved by the different homopolymer contained tends to be poor, because such a polyethylene oxide is lost due to volatilization, vaporization, or the like during a heat treatment at a high temperature. Meanwhile, if the value of n exceeds the upper limit, the molecular weight is so high that the molecular mobility is low. Hence, the speed of the phase separation is lowered so that the formation of the micro phase separation structure tends to be inefficient.

In addition, the number average molecular weight (Mn) of the different homopolymer is preferably 460 to 220000, and more preferably 2200 to 46000. If the number average molecular weight is less than the lower limit, the molecular weight is so low that the above-described effect achieved by the different homopolymer contained tends to be poor, because the different homopolymer is lost due to volatilization, vaporization, or the like during a heat treatment at a high temperature. Meanwhile, if the number average molecular weight (Mn) exceeds the upper limit, the molecular weight is so high that the molecular mobility is low. Hence, the speed of the phase separation is lowered, so that the formation of the micro phase separation structure tends to be inefficient.

The molecular weight distribution (Mw/Mn) of the different homopolymer is preferably 1.5 or less, and more preferably 1.0 to 1.3. If the molecular weight distribution exceeds the upper limit, it tends to be difficult to maintain the uniformity of the shape of the micro phase separation. Note that the number average molecular weight (Mn) and the weight average molecular weight (Mw) are values measured by gel permeation chromatography (GPC) and converted to molecular weights of standard polystyrene.

In addition, when the different homopolymer is used, it is preferable that the combination of the first homopolymer and the second homopolymer in the block copolymer be a combination of polystyrene and polymethyl methacrylate (polystyrene-polymethyl methacrylate), and the different homopolymer be a polyalkylene oxide. The use of a polystyrene-polymethyl methacrylate block copolymer and a polyalkylene oxide in combination as described above further improves the orientation in the vertical direction, making it possible to further increase the depths of the concavities and convexities on the surface, and also shorten the heat treatment time in the manufacturing.

When the different homopolymer is used in the block copolymer solution, the content thereof is preferably 100 parts by mass or less, and more preferably 5 parts by mass to 100 parts by mass, relative to 100 parts by mass of the block copolymer. If the content of the different homopolymer is less than the lower limit, the effect obtained by the different homopolymer contained tends to be poor.

In addition, when the surfactant is used, the content thereof is preferably 10 parts by mass or less relative to 100 parts by mass of the block copolymer. Moreover, when the ionic compound is used, the content thereof is preferably 10 parts by mass or less relative to 100 parts by mass of the block copolymer.

In addition, when the block copolymer solution comprises the different homopolymer, the total percentage content of the block copolymer and the different homopolymer is preferably 0.1 to 15% by mass, and more preferably 0.3 to 5% by mass, in the block copolymer solution. If the total percentage content is less than the lower limit, it is difficult to uniformly apply the solution in a film thickness sufficient to obtain a necessary film thickness. If the total percentage content exceeds the upper limit, it is relatively difficult to prepare a solution with uniform dissolution in a solvent.

In addition, the base material used in the step (I) is not particularly limited, and examples thereof include substrates of resins such as polyimide, polyphenylene sulfide (PPS), polyphenylene oxide, polyether ketone, polyethylene naphthalate, polyethylene terephthalate, polyarylate, triacetyl cellulose, and polycycloolefin; inorganic substrates such as substrates of glass, octadecyldimethylchlorosilane (ODS)-treated glass, octadecyltrichlorosilane (OTS)-treated glass, organo silicate-treated glass, silicon, and the like; and substrates of metals such as aluminum, iron, and copper. In addition, the base material may be subjected to surface treatments such as an orientation treatment. Note that, by treating a surface of a substrate of glass or the like with ODS, an organo silicate, or the like as described above, a micro phase separation structure such as a lamellar structure, a cylindrical structure, or a spherical structure becomes more likely to be arranged perpendicularly to the surface in a heating step described later. This is because, by reducing the difference in interfacial energy between the block copolymer component and the surface of the base material, the domains of the blocks constituting the block copolymer become more likely to be oriented perpendicularly.

A method for applying the block copolymer solution onto the base material is not particularly limited, and, for example, a spin coating method, a spray coating method, a dip coating method, a dropping method, a gravure printing method, a screen printing method, a relief printing method, a die coating method, a curtain coating method, or an inkjet method can be employed as the method.

The thickness of the coating film of the block copolymer formed on the base material is preferably 10 to 3000 nm, and more preferably 50 to 500 nm, in terms of the thickness of a coating film after drying.

<Step (II)>

The step (II) is a step of drying the coating film on the base material. The step of drying the coating film is not particularly limited, and may be conducted in an air atmosphere. In addition, the drying temperature in this step is not particularly limited, as long as the solvent can be removed from the coating film at the temperature. The drying temperature is preferably 30 to 200° C., and more preferably 40 to 100° C. Note that, in some cases, the block copolymer starts to form the micro phase separation structure during the drying, so that concavities and convexities are formed on the surface of the coating film (thin film).

<Step (III)>

The step (III) is a step (first heating step) of heating the coating film dried in the step (II) at a temperature not lower than a glass transition temperature (Tg) of the block copolymer.

By heating the coating film at a temperature not lower than the glass transition temperature (Tg) of the block copolymer in the coating film as described above, self-assembly of the block copolymer in the coating film is allowed to proceed, so that micro phase separation of the block copolymer into portions of the first polymer segment and the second polymer segment can be caused. This makes it possible to efficiently form the micro phase separation structure.

In the first heating step (III), the heating temperature is set at a temperature not lower than the glass transition temperature (Tg). If the heating temperature is lower than the glass transition temperature (Tg) of the block copolymer, the molecular mobility of the polymer is low. Hence, the self-assembly of the block copolymer does not proceed sufficiently, so that the formation of the micro phase separation structure tends to be insufficient, or a longer heating time tends to be required to sufficiently form the micro phase separation structure. In addition, the upper limit of the heating temperature is not particularly limited, unless the block copolymer is thermally decomposed at the temperature. A method for carrying out the first heating step is not particularly limited, and, for example, a method may be employed in which an oven or the like is used, as appropriate, in an air atmosphere. Note that the drying and heating steps (steps (II) and (III)) may be performed continuously by gradually elevating the heating temperature. Note that when the drying and heating steps are continuously carried out by gradually elevating the heating temperature as described above, the drying step (step (II)) is included in the heating step (step (III)).

<Step (IV)>

The step (IV) is a step (etching step) of removing the second polymer (segment) by an etching treatment on the coating film subjected to the step (III), to thereby form a concavity and convexity structure on the base material.

In the etching step (IV), one (the second polymer segment) of the polymer segments constituting the block copolymer is selectively removed by etching utilizing the following fact. Specifically, since the first polymer segment and the second polymer segment have different molecular structures, the first polymer segment and the second polymer segment have different etching rates (ease of etching). Hence, one (the second polymer segment) of the polymer segments can be selectively removed depending on the kinds of the homopolymers of the first polymer segment and the second polymer segment. By removing the second polymer segment from the coating film in the etching step, an excellent concavity and convexity structure originated from the micro phase separation structure (the structure formed in the step (III)) of the block copolymer can be efficiently formed on the coating film.

As the etching treatment for selectively removing one of the polymer segments as described above, for example, an etching method using a reactive ion etching method, an ozone oxidation method, a hydrolysis method, a metal ion staining method, an ultraviolet-ray etching method, or the like can be employed, as appropriate. In addition, as the etching treatment, a method may be employed in which covalent bonds of the block copolymer are cleaved by a treatment with at least one selected from the group consisting of acids, bases, and reducing agents, and then the coating film in which the micro phase separation structure is formed is washed with a solvent capable of dissolving only the one polymer segment, or the like, thereby removing only the one polymer segment, while keeping the micro phase separation structure.

<Step (V)>

The step (V) is a step (second heating step) of heating the concavity and convexity structure formed in the step (IV) at a temperature not lower than a glass transition temperature (Tg) of the first polymer (segment). The second heating step (v) is performed as a so-called annealing treatment, and the heating makes smoother a line connecting the lowermost portion of each of the concave portions and the vertex of a corresponding one of the convex portions forming the concavity and convexity structure, and makes smaller the kurtosis of the concavity and convexity shape.

The heating temperature in the second heating step (V) is preferably not lower than the glass transition temperature of the first polymer segment remaining after the etching (not lower than the glass transition temperature of the first homopolymer), and more preferably not lower than the glass transition temperature of the first homopolymer but not higher than a temperature (Tg+70° C.) which is higher than the glass transition temperature of the first homopolymer by 70° C. If the heating temperature is lower than the glass transition temperature of the first homopolymer, a desired concavity and convexity structure tends not to be obtained after the electroforming step to be described later, or a longer heating time tends to be required for forming a desired concavity and convexity structure. Meanwhile, if the heating temperature exceeds the upper limit, the concavity and convexity shape tends to collapse to a great extent, because the entire first polymer segment is melt or decomposed. As a method for actually carrying out the second heating step, for example, the second heating step may be performed, for example, in an air atmosphere by using an oven or the like, as appropriate, as in the case of the first heating step.

Note that the sectional structure of the concavity and convexity structure subjected to the etching step (IV) can be so complicated that side surfaces of grooves defined by the concavity and convexity structure are rough, and concavities and convexities (including overhangs) are formed in a direction perpendicular to the thickness direction. The higher the molecular weight of the block copolymer is, the more likely to be formed the concavities and convexities present on the side surfaces of the convex portion are. On the other hand, the molecular weight of the block copolymer has a close relationship with the micro phase separation structure, and, in turn, the pitches of the diffraction grating obtained therefrom. In this respect, even when a block copolymer having a relatively high molecular weight is used in order to more efficiently achieve a distribution of pitches preferable for the first concavities and convexities, it can be said that it is preferable to perform the second heating step as described above in order to more reliably obtain a concavity and convexity structure having such a desired pitch distribution by electroforming. In the second heating step (V), by heating the concavity and convexity structure subjected to the etching step (IV), an annealing treatment is performed on the first polymer segment constituting the side surfaces of the concavity and convexity shape, so that the sectional shape defined by the first polymer segment can be a relatively smooth inclined surface (the lines each connecting the lowermost portion of a concave portion and the vertex of a convex portion can be made smoother). As a result, a mountain-like shape tapered upward from the base material (referred to as "mountain-shaped structure" herein) is obtained. The concavities and convexities on the side surfaces are annealed by the heating as described above, and the overhang portions turn into smooth inclined surfaces by the heating. Hence, the concavities and convexities of the mountain-shaped structure obtained in the second heating step (V) make it possible to more easily peel a metal layer deposited on the first polymer segment, and efficiently transfer the concavity and convexity shape to the metal layer.

Here, if the side surfaces of the groves defined by the concavity and convexity structure subjected to the etching step (IV) are rough, and concavities and convexities (including overhangs) are formed in the direction perpendicular to the thickness direction, portions to which the seed layer for the electroforming is not attached are likely to be formed, and hence it tends to be difficult to uniformly deposit the metal layer by the electroforming. For this reason, when a first polymer segment layer having a concavity and convexity structure with rough side surfaces is used as it is, the mechanical strength of the obtained mold tends to be low, and deformation of the mold and defects such as pattern defects tend to occur. In addition, it tends to be difficult to obtain an electroforming film having a uniform film thickness in the case of a complicated sectional structure of concavities and convexities with rough side surfaces, because, in electroforming (electroplating), the thickness of the plating varies among portions depending on the shape of a workpiece, and a metal to be plated is more likely to be attracted to convex portions and projecting corners of the workpiece, but is less likely to be attracted to concave portions and recessed portions. Moreover, suppose a case where such a complicated sectional structure can be transferred to a mold obtained by electroforming. Even in such a case, when transfer of the concavity and convexity shape is attempted by pressing the mold to a diffraction grating formation material (for example, a curable resin), the diffraction grating formation material (for example, a curable resin) enters spaces in the complicated sectional structure of the mold. Hence, the mold cannot be peeled from the concavity and convexity layer after curing, or portions of the mold with low strength may fracture, so that pattern defects may occur. In view of these points in combination, it is preferable to perform the second heating step as described above from the viewpoint of more reliably obtaining a concavity and convexity structure having such a desired pitch distribution by electroforming.

The base material having the concavities and convexities (the concavities and convexities of the mountain-shaped structure) obtained by performing the second heating step (V) as described above can be suitably used as a master for transfer to a metal in a subsequent step. In addition, the average pitch of the concavities and convexities is preferably within a range from 10 to 700 nm, and more preferably within a range from 100 to 700 nm. If the average pitch of the concavities and convexities is less than the lower limit, the pitch is so small relative to wavelengths of the visible light that diffraction of the visible light, which is necessary for a diffraction grating obtained by using such a master block, is less likely to occur. Meanwhile, if the average pitch exceeds the upper limit, the diffraction angle of a diffraction grating obtained by using such a master block is so small that the functions as a diffraction grating cannot be exhibited sufficiently. Note that the average pitch of the concavities and convexities refers to an average value of pitches of the concavities and convexities, where pitches (distances between adjacent convex portions or between adjacent concave portions) of the concavities and convexities on the surface of the concavity and convexity layer (the layer made of the first polymer segment) formed on the base material are measured. In addition, a value calculated as follows is employed as the average value of pitches of the concavities and convexities. Specifically, a concavity and convexity analysis image of the shape of the concavities and convexities on the surface is obtained by use of a scanning probe microscope (for example, one manufactured by SII NanoTechnology Inc. under the product name of "E-sweep," or the like). Then, distances between randomly selected adjacent convex portions or between randomly selected adjacent concave portions are measured at 100 points or more in the concavity and convexity analysis image, and the average of these distances are determined.

Meanwhile, the average height of the concavities and convexities formed on the base material is preferably within a range from 20 to 100 nm, more preferably within a range from 30 to 100 nm, and further preferably within a range from 40 to 80 nm. If the average height of the concavities and convexities is less than the lower limit, the height is so insufficient relative to the wavelengths of the visible light that the diffraction tends to be insufficient. Meanwhile, suppose a case where the average height exceeds the upper limit. In such a case, when the obtained diffraction grating is used as an optical element on the light extraction port side of an organic EL element, destruction of the element and life-shortening of the element tend to occur because of heat generation which occurs when the electric field distribution inside the EL layer becomes nonuniform, and hence electric fields concentrate on a certain position. Note that the average height of the concavities and convexities herein refers to an average value of heights of the concavities and convexities, where the heights of concavities and convexities (distances between concave portions and convex portions in the depth direction) on the surface of the concavity and convexity layer (the layer made of the first polymer segment) formed on the base material are measured. In addition, a value calculated as follows is employed as the average value of the heights of the concavities and convexities. Specifically, a concavity and convexity analysis image of the shape of the concavities and convexities on the surface is obtained by use of a scanning probe microscope (for example, one manufactured by SII NanoTechnology Inc. under the product name of "E-sweep," or the like). Then, distances between randomly selected concave portions and convex portions in the depth direction are measured at 100 points or more in the concavity and convexity analysis image, and the average of these distances is determined.

Note that characteristics (the average height, the average pitch, the average value (m), and the like) of the concavities and convexities of the base material having the concavities and convexities (the concavities and convexities of the mountain-shaped structure) can be easily adjusted to desired ones, by adjusting the kind of the block copolymer, the heating temperature in the heat treatment, and the like, or by other means.

<Step (VI) to Step (VIII)>

The step (VI) is a step of forming a seed layer on the concavity and convexity structure subjected to the step (V). The step (VII) is a step of stacking a metal layer on the seed layer by electroforming (electrolytic plating). The step (VIII) is a step of peeling the base material having the concavity and convexity structure from the metal layer and the seed layer. These steps are described below with reference to FIGS. 2 to 5.

Figure 2:
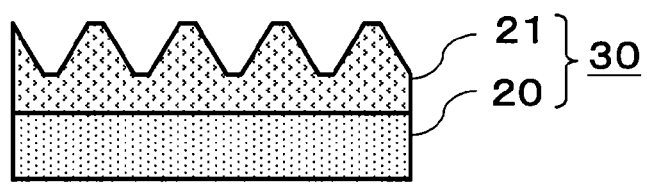
FIG. 2 is a cross-sectional view schematically showing one embodiment of a base material (a transfer master) in which a layer made of a first polymer segment and having concavities and convexities of a mountain-shaped structure is formed.
Figure 3:
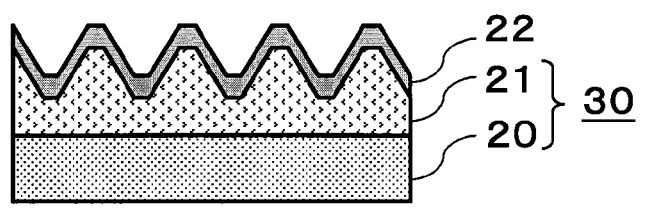
FIG. 3 is a cross-sectional view schematically showing a state where a seed layer is stacked on the concavities and convexities on the surface of the base material (transfer master) in which the layer made of the first polymer segment and having the concavities and convexities of the mountain-shaped structure is formed.
Figure 4:
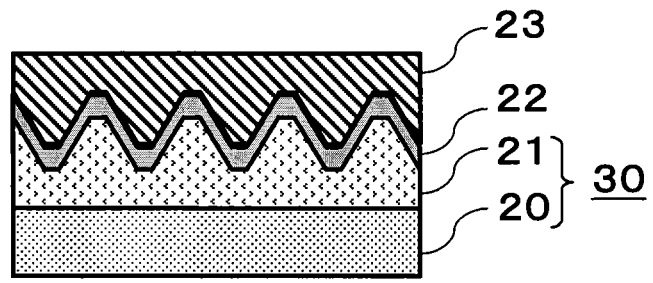
FIG. 4 is a cross-sectional view schematically showing a state where a metal layer is formed on the seed layer.
Figure 5:
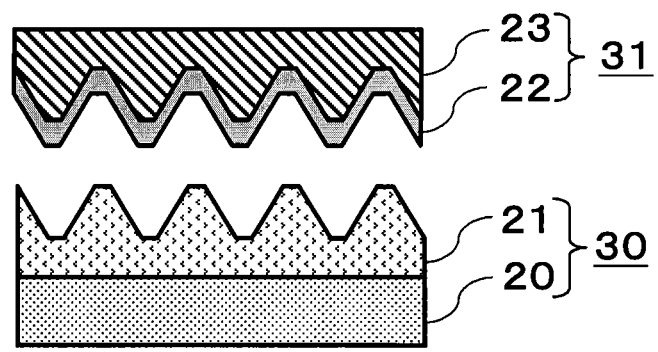
FIG. 5 is a cross-sectional view schematically showing a state where a metal portion (master block) comprising the metal layer and the seed layer stacked on the surface of the transfer master is peeled from the transfer master.

FIG. 2 is a cross-sectional view schematically showing a transfer master 30 in which a layer 21 made of the first polymer segment and having concavities and convexities of a mountain-shaped structure is formed on a base material 20. FIG. 3 is a cross-sectional view schematically showing a state where a seed layer 22 is formed on the concavities and convexities on the surface of the layer 21 made of the first polymer segment in the transfer master 30. FIG. 4 shows a state where a metal layer 23 is formed on the surface of the seed layer 22 by electroforming (electrolytic plating). FIG. 5 is a cross-sectional view schematically showing a state where the metal layer 23 and the seed layer 22 are peeled from the transfer master 30.

In the step (VI), the seed layer 22 is formed on the concavity and convexity structure of the base material (the transfer master 30), the concavity and convexity structure being obtained after the step (V) is performed (see FIGS. 2 and 3).

The seed layer 22 is to serve as a conductive layer for a subsequent electroforming treatment. A method for forming the seed layer 22 is not particularly limited, and it is possible to employ, as appropriate, a known method capable of forming a so-called conductive layer on the concavity and convexity-shaped layer 21 formed on the surface of the base material 20 into such a shape that the shape of the concavities and convexities is maintained. For example, the seed layer 22 can be formed by a method such as electroless plating, sputtering, or vapor deposition.

In addition, the thickness of the seed layer 22 is preferably 10 nm or more, and more preferably 100 nm or more, in order to make uniform the current density in the subsequent electroforming step, and thereby make uniform the thickness of the metal layer to be deposited in the subsequent electroforming step. In addition, a material of the seed layer is not particularly limited, and it is possible to use, for example, nickel, copper, gold, silver, platinum, titanium, cobalt, tin, zinc, chromium, a gold-cobalt alloy, a gold-nickel alloy, a boron-nickel alloy, solder, a copper-nickel-chromium alloy, a tin-nickel alloy, a nickel-palladium alloy, a nickel-cobalt-phosphorus alloy, an alloy thereof, or the like.

After the seed layer 22 is formed on the surface (the concavity and convexity-shaped surface) of the layer 21 made of the first polymer segment of the transfer master 30 as described above, a metal layer is stacked on the seed layer by electroforming (electrolytic plating) (Step (VII): see FIG. 4).

The thickness of the metal layer 23 is not particularly limited, and, for example, the total thickness including the thickness of the seed layer 22 may be 10 to 3000 μm. Any one of the above-described metal species usable for the seed layer 22 can be used as a material of the metal layer 23 deposited by the electroforming. As the material of the metal layer 23, nickel is preferable from the viewpoints of wear resistance, releasability, and the like of the obtained mold. In this case, it is preferable to use nickel also for the seed layer 22.

In addition, conditions of the electroforming for forming the metal layer 23 are not particularly limited, and conditions employed in a known electrolytic plating method may be employed as appropriate. In addition, the current density for the electroforming may be, for example, 0.03 to 10 A/cm$^2$, from the viewpoints that a uniform metal layer is formed by preventing bridge, and that the electroforming time is shortened.

Note that when the mold comprising the metal layer 23 and the seed layer 22 is used, the metal layer 23 is subjected to treatments such as the pressing to the resin layer, the peeling, and washing. Hence, the metal layer 23 preferably has a moderate hardness and a moderate thickness from the viewpoint of ease of these treatments. From such a viewpoint, a diamond-like carbon (DLC) treatment or a Cr plating treatment may be performed on the surface of the metal mold in order to improve the hardness of the metal layer 23 formed by the electroforming. Alternatively, the surface hardness of the metal layer 23 may be increased by further performing a heat treatment on the metal layer 23.

After the metal layer 23 is formed as described above, a metal portion 31 comprising the metal layer 23 and the seed layer 22 is peeled from the base material (the transfer master 30) having the concavity and convexity structure as shown in FIG. 5 (step (VIII)).

A master block (mold) for forming a diffraction grating can be obtained by peeling the thus obtained metal portion 31 comprising the seed layer 22 and the metal layer 23 from the base material having the concavity and convexity structure. In other words, a master block (mold) 31 for forming a diffraction grating comprising the seed layer 22 and the metal layer 23 can be obtained as described above.

A method for peeling the master block (mold) 31 for forming a diffraction grating is not particularly limited, and a known method can be employed as appropriate. A physically peeling method may be employed, or a method may be employed in which the mold (metal portion) 31 is peeled off by removing by dissolution of the first homopolymer and the remaining block copolymer by use of an organic solvent, such as toluene, tetrahydrofuran (THF), or chloroform, capable of dissolving them. In addition, in the thus obtained mold 31, the characteristics of the concavities and convexities of the transfer master 30 are transferred (inverted).

In addition, when the master block (mold) 31 for forming a diffraction grating is peeled from the transfer master 30 (the base material 10 on which the layer 21 having the concavities and convexities of the mountain-shaped structure is stacked), part of the polymer, for example, the first polymer segment, may remain in a state of being attached to the surface of the mold, in some cases, depending of the method for the peeling treatment. In such a case, the polymer attached to and remaining on the surface of the mold is preferably removed by washing. As a method for the washing, wet washing or dry washing can be employed. In addition, examples of the method for the wet washing include methods for removal by washing with an organic solvent such as toluene or tetrahydrofuran, a surfactant, or an alkali-based solution. Note that when an organic solvent is used, ultrasonic cleaning may be performed. In addition, the polymer attached to and remaining on the surface of the mold may be removed by electrolytic cleaning. Meanwhile, an example of the method for the dry washing is a method for removal by ashing using ultraviolet rays or plasma. The polymer attached to and remaining on the surface of the mold may be removed by washing in which a combination of such wet washing and dry washing is employed. In addition, after such washing, the mold may be rinsed with pure water or purified water, dried, and then subjected to ozone irradiation.

Hereinabove, the method for manufacturing a master block (mold) for forming a diffraction grating comprising the steps (I) to (VIII) is described. However, the method for manufacturing such a master block (mold) for forming a diffraction grating having the concavities and convexities formed therein is not particularly limited, and a known method can be employed as appropriate. For example, a resin layer having a concavity and convexity structure originated from the micro phase separation structure of the block copolymer obtained by caring out the steps (I) to (IV) (preferably, caring out the step (V) in combination) as it is may be used as a mold. Alternatively, by using a resin layer having a concavity and convexity structure originated from the micro phase separation structure of the block copolymer obtained by caring out the steps (I) to (IV) (preferably, caring out the step (V) in combination), a transfer material (a material other than the above-described seed layer and metal layer) is attached onto the surface of the concavity and convexity structure of the resin layer, and the transfer material is cured, and then detached. Thus, a concavity and convexity transfer member having concavities and convexities formed on a surface thereof is obtained, and this concavity and convexity transfer member may be used as a master block (mold) for forming a diffraction grating. The transfer material is not particularly limited, and, for example, may be a resin composition of a silicone-based polymer (silicone rubber), a urethane rubber, a norbornene resin, a polycarbonate, polyethylene terephthalate, polystyrene, polymethyl methacrylate, acrylic resin, liquid crystal polymer, an epoxy resin, or the like. In addition, a method for attached the transfer material is not particularly limited, and, for example, a vacuum vapor deposition method; or various coating methods such as a spin coating method, a spray coating method, a dip coating method, a dropping method, a gravure printing method, a screen printing method, a relief printing method, a die coating method, a curtain coating method, an inkjet method, and a sputtering method can be employed. In addition, although conditions for curing the transfer material vary depending on the kind of the transfer material used, for example, the curing temperature is preferably within a range from room temperature to 250° C., and the curing time is preferably within a range from 0.5 minutes to 3 hours. In addition, a method may be employed in which the transfer material is cured by irradiation with energy rays such as ultraviolet rays or electron beams. In this case, the amount of irradiation is preferably within a range from 20 mJ/cm$^2$ to 10 J/cm$^2$. A final mold (master block) may be manufactured by repeating the step using the transfer material, and thus repeating the inversion and transfer of the concavities and convexities. Even when concavities and convexities (including overhangs) are formed on side surfaces of convex portions of a concavity and convexity structure (the concavity and convexity structure of the master) not subjected to the inversion and transfer of the concavities and convexities, the sectional shape can be smoothed every time the step is performed (the lines each connecting the lowermost portion of a concave portion and the vertex of a corresponding convex portion can be made smoother) by repeating the inversion and transfer of the concavities and convexities by use of such a transfer material. For this reason, even when concavities and convexities (including overhangs) are formed on side surfaces of convex portions of the concavity and convexity structure (the concavity and convexity structure of the master) not subjected to the inversion and transfer of the concavities and convexities, the shape of the concavities and convexities can be made a desired shape (for example, the mountain-like shape as described above) by repeating the inversion and transfer of the concavities and convexities by use of such a transfer material.

In addition, the concavity and convexity shape of the finally obtained master block (mold) for forming a diffraction grating preferably has characteristics similar to those of the above-described first concavities and convexities. The shape of the concavities and convexities can be easily adjusted by changing, as appropriate, the kind of the polymer used, the heating conditions in the heating step, and the like.

Next, a step (a step of manufacturing a diffraction grating) is described in which the obtained master block (mold) 31 for forming a diffraction grating is used. Specifically, in this step, a diffraction grating formation material (for example, a curable resin) is applied onto a transparent supporting substrate, and is cured with the master block being pressed thereto. Then, the master block is detached, so that a concavity and convexity layer having concavities and convexities formed thereon is stacked on the transparent supporting substrate.

Figure 6:
FIG. 6 is a cross-sectional view schematically showing a state where a diffraction grating formation material is applied onto a transparent supporting substrate.
Figure 7:
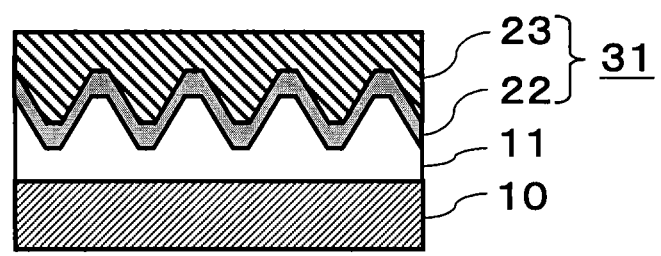
FIG. 7 is a cross-sectional view schematically showing a state where the diffraction grating formation material is cured with the master block for forming a diffraction grating being pressed thereto.
Figure 8:
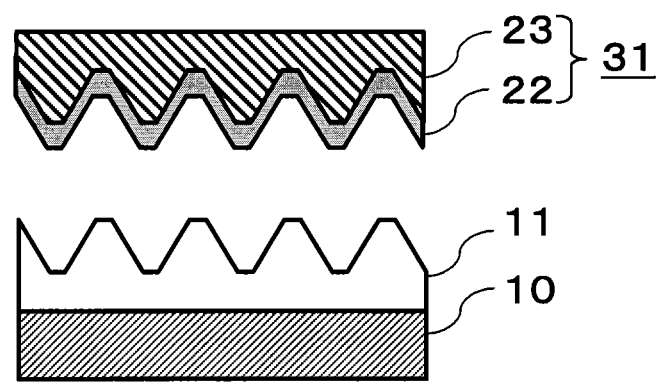
FIG. 8 is a cross-sectional view schematically showing a state where concavities and convexities are formed on a surface of the diffraction grating 11 by detaching the master block for forming a diffraction grating.

FIGS. 6 to 8 are schematic diagrams for describing a preferred embodiment of a method for manufacturing a diffraction grating. Here, FIG. 6 is a cross-sectional view schematically showing a state where a diffraction grating formation material 11' (for example, a resin material or a transparent inorganic layer formation material) is applied onto the transparent supporting substrate 10. FIG. 7 is a cross-sectional view schematically showing a state where the diffraction grating formation material is cured with the master block 31 being pressed thereto. FIG. 8 is a cross-sectional view schematically showing a state where concavities and convexities are formed on the surface of the diffraction grating (first concavity and convexity layer) 11 by detaching the master block 31.

In the step of manufacturing a diffraction grating, first, the diffraction grating formation material 11' (for example, a curable resin or the like) is applied onto the transparent supporting substrate 10 (see FIG. 6). After that, with the master block (mold) 31 for forming a diffraction grating being pressed to a coating film of the diffraction grating formation material 11', the diffraction grating formation material is cured (see FIG. 7).

The transparent supporting substrate 10 is the same as the transparent supporting substrate 10 described above. In addition, the diffraction grating formation material 11' is a material (a resin material or a transparent inorganic layer formation material) described as a material for forming the first concavity and convexity layer (diffraction grating) 11.

When a transparent inorganic layer formation material is used as the diffraction grating formation material 11' (when an inorganic layer is used as the concavity and convexity layer), a sol containing a metal material is preferably used to more efficiently form a concavity and convexity layer to which the pattern is transferred by sol-gel process. The sol containing a metal material is not particularly limited. For example, when an inorganic concavity and convexity layer made of silica is formed, the sol may be a sol containing a silica precursor (metal alkoxide). In addition, examples of the silica precursor include metal alkoxides including tetraalkoxide monomers such as tetramethoxysilane (TMOS), tetraethoxysilane (TEOS), tetra-i-propoxysilane, tetra-n-propoxysilane, tetra-i-butoxysilane, tetra-n-butoxysilane, tetra-sec-butoxysilane, and tetra-t-butoxysilane; trialkoxide monomers such as methyltrimethoxysilane, ethyltrimethoxysilane, propyltrimethoxysilane, isopropyltrimethoxysilane, phenyltrimethoxysilane, methyltriethoxysilane, ethyltriethoxysilane, propyltriethoxysilane, isopropyltriethoxysilane, phenyltriethoxysilane, methyltripropoxysilane, ethyltripropoxysilane, propyltripropoxysilane, isopropyltripropoxysilane, phenyltripropoxysilane, methyltriisopropoxysilane, ethyltriisopropoxysilane, propyltriisopropoxysilane, isopropyltriisopropoxysilane, and phenyltriisopropoxysilane; polymers obtained by polymerizing a small amount of any of these monomers; composite materials obtained by introducing a functional group or a polymer into part of any of the above-described materials; and the like. Note that the sol only needs to be capable of forming an inorganic layer in a sol-gel process, and the kind of the metal material is not particularly limited. Examples of the metal material other than metal alkoxides include metal acetylacetonates, metal carboxylates, oxychlorides, chlorides, mixtures thereof, and the like. Moreover, the metal species in the metal material is not particularly limited, and a metal species other than silicon (Si) can also be used as appropriate, as long as the metal species is capable of forming an inorganic layer in a sol-gel process. For example, Ti, Sn, Al, Zn, Zr, In, or the like may be used, as appropriate. In addition, one of the above-described metal materials may be used alone, or a combination of two or more thereof may be used as a mixture. In addition, as the sol, one obtained by mixing, as appropriate, precursors of the inorganic layer (a layer made of a simple substance of the metal or an oxide of the metal) can also be used. In addition, when a mixture of TEOS and MTES is used as the sol, the blending ratio thereof is not particularly limited, and may be 1:1.

Moreover, examples of the solvent of the sol include alcohols such as methanol, ethanol, isopropyl alcohol (IPA), and butanol; aliphatic hydrocarbons such as hexane, heptane, octane, decane, and cyclohexane; aromatic hydrocarbons such as benzene, toluene, xylene, and mesitylene; ethers such as diethyl ether, tetrahydrofuran, and dioxane; ketones such as acetone, methyl ethyl ketone, isophorone, and cyclohexanone; ether alcohols such as butoxyethyl ether, hexyloxyethyl alcohol, methoxy-2-propanol, and benzyloxyethanol; glycols such as ethylene glycol and propylene glycol; glycol ethers such as ethylene glycol dimethyl ether, diethylene glycol dimethyl ether, and propylene glycol monomethyl ether acetate; esters such as ethyl acetate, ethyl lactate, and γ-butyrolactone; phenols such as phenol and chlorophenol; amides such as N,N-dimethylformamide, N,N-dimethylacetamide, and N-methylpyrrolidone; halogen-containing solvents such as chloroform, methylene chloride, tetrachloroethane, monochlorobenzene, and dichlorobenzene; hetero element-containing compounds such as carbon disulfide; water; and mixture solvents thereof. In particular, ethanol and isopropyl alcohol are preferable, and mixtures of ethanol or isopropyl alcohol with water are also preferable.

Moreover, examples of additives which can be added to the sol include polyethylene glycol, polyethylene oxide, hydroxypropyl cellulose, and polyvinyl alcohol for adjusting the viscosity; alkanolamines such as triethanolamine, β-diketones such as acetylacetone, β-ketoesters, formamide, dimethylformamide, and dioxane, which are solution stabilizers; and the like.

In addition, the coating thickness of the diffraction grating formation material is preferably within a range in which the thickness of the first concavity and convexity layer (diffraction grating) 11 can be 0.01 to 500 µm (more preferably 0.5 to 500 µm). If the coating thickness of the diffraction grating formation material is less than the lower limit, the heights of the concavities and convexities formed on the surface of the first concavity and convexity layer tend to be insufficient. Meanwhile, if the coating thickness exceeds the upper limit, an effect of volume change of the diffraction grating formation material (for example, a resin) which occurs upon curing tends to be so large that the formation of the concavity and convexity shape tends to be poor.

In addition, examples of methods which can be employed as a method for applying the diffraction grating formation material 11' (including the sol) onto the transparent supporting substrate 10 include various coating methods such as a spin coating method, a spray coating method, a dip coating method, a dropping method, a gravure printing method, a screen printing method, a relief printing method, a die coating method, a curtain coating method, an inkjet method, and a sputtering method. Moreover, when the diffraction grating formation material is a resin material (for example, a curable resin), for example, the curing temperature is preferably within a range from room temperature to 250° C., and the curing time is preferably within a range from 0.5 minutes to 3 hours, although conditions for curing the resin material varies depending on the kind of the resin used. Alternatively, a method may be employed in which the resin material is cured by irradiation with energy rays such as ultraviolet rays or electron beams. In such a case, the amount of irradiation is preferably within a range from 20 mJ/cm$^2$ to 5 J/cm$^2$.

In addition, when the diffraction grating formation material is cured by using the sol (when an inorganic layer is formed), a cured layer (an inorganic layer) may be formed from the sol by employing, as appropriate, known conditions which can be employed in the so-called sol-gel process, depending on the metal species and the kind of the metal material used. For example, when an inorganic layer (concavity and convexity layer) made of silica is formed by using a sol containing a silica precursor, the inorganic layer can be formed by performing hydrolysis and a polycondensation reaction to synthesize amorphous silica. The hydrolysis and the polycondensation reaction are not particularly limited, as long as these are performed under conditions where the amorphous silica can be synthesized. It is preferable to add an acid such as hydrochloric acid or an alkali such as ammonia to adjust the pH of the sol. It is more preferable to adjust the pH to 4 or lower or 10 or higher. In addition, additional water may be added for performing the hydrolysis. Note that when additional water is added for performing the hydrolysis as described above, the amount of water added is preferably 1.5 times or more in terms of molar ratio relative to the metal alkoxide species. In addition, when a transparent inorganic layer formation material is used as the diffraction grating formation material 11' (when an inorganic layer is formed as the concavity and convexity layer), it is preferable to use a heated pressing roll for pressing the master block (mold) 31 for forming a diffraction grating to the coating film of the sol. By pressing the mold to the coating film with heating as described above, the coating film can be cured with the mold being pressed thereto. Hence, the formation of the concavity and convexity layer tends to be more efficient. In addition, after the inorganic layer is formed by curing the transparent inorganic layer formation material described above, it is preferable to further heat the inorganic layer at a temperature of 200 to 1200° C. for 5 minutes to 6 hours, from the viewpoint of increasing the mechanical strength.

Note that the heat resistance of the diffraction grating 11 tends to be improved in a case where the diffraction grating 11 is formed of the transparent inorganic layer formation material, as compared with a case where a resin material is used. For this reason, when the diffraction grating 11 formed of the transparent inorganic layer formation material is used for manufacturing an organic EL element, not only an organic EL element having a higher power efficiency can be obtained because a film of a low-resistant transparent electrode (for example, ITO) can be formed efficiently by the so-called sputtering with heating, but also degradation due to high temperature can be suppressed further sufficiently because the diffraction grating 11 does not undergoes color change or the like even when the organic EL element is used under a high-temperature condition. In addition, when the diffraction grating 11 is formed of the transparent inorganic layer formation material, it is also possible to wash the concavity and convexity pattern surface of the diffraction grating 11 with a brush before the element is assembled. Here, a comparison is made between a case where the transparent inorganic layer formation material is used as a material for forming the concavity and convexity layer and a case where a resin material is used. In the former case, the mechanical strength of the surface of the concavity and convexity layer is higher, and the formation of scars on the surface of the layer can be suppressed more sufficiently during the brush-washing process (basically, no scars are formed). Hence, the surface of the concavity and convexity layer can be washed efficiently, and foreign substances and the like on the surface can be removed more efficiently. For this reason, defects due to foreign substances on the surface or the like can be sufficiently suppressed (the defective rate can be lowered). Moreover, a layer having a better chemical resistance can be formed, and hence the alkaline resistance of the layer can be improved to a higher level in a case where the diffraction grating 11 is formed of the transparent inorganic layer formation material than in a case where a resin material is used. For this reason, various washing solvents can be used in the step of washing the surface. In other words, the washing liquid is not particularly limited in the washing step conducted before the element is assembled, and alkalis or various organic solvents can be used as appropriate. Moreover, as described above, a layer having a better chemical resistance can be formed in a case where the diffraction grating 11 is formed of the transparent inorganic layer formation material than in a case where a resin material is used. Hence, damage due to a resist or a developer of ITO patterning tends to be more reduced in the former case. In addition, a higher level of UV resistance can be imparted to the diffraction grating 11 in a case where the diffraction grating 11 is formed of the transparent inorganic layer formation material than in a case where a resin material is used. Hence, when the diffraction grating 11 is formed of the transparent inorganic layer formation material, organic contaminants can be efficiently removed by UV ozone washing, so that the defective rate due to organic contaminants can be reduced. Moreover, even when the diffraction grating 11 is used outdoors, degradation due to sunlight can be sufficiently suppressed, and a higher weather resistance tends to be achieved.

In addition, in the step of manufacturing a diffraction grating, next, the master block 31 is detached from the cured diffraction grating (first concavity and convexity layer) 11 (see FIG. 8). A method for detaching the master block 31 from the cured diffraction grating (first concavity and convexity layer) 11 as described above is not particularly limited, and a known method can be employed, as appropriate. Thus, the first concavity and convexity layer (diffraction grating) 11 having concavities and convexities formed thereon can be stacked on the transparent supporting substrate 10.

Note that when the concavity and convexity structure of the master block (mold 31) is transferred to the diffraction grating formation material (for example, a curable resin) in caring out this step, a mold-release treatment may be performed on the master block in order to improve the mold releasability from the diffraction grating formation material. The mold-release treatment is not particularly limited, and a scheme of lowering the surface energy is employed, in general. Examples of the mold-release treatment include a method in which the concavity and convexity surface of the mold 31 is coated with a mold release agent such as a fluorine-containing material or a silicone resin, or subjected to a treatment with a fluorine-containing silane coupling agent, a method in which a film of diamond-like carbon is formed on the surface, and the like.

Thus, the transparent supporting base member 10 provided with the diffraction grating 11 having a desired pattern can be obtained. Further, the step of manufacturing a diffraction grating 11 may be again carried out by using the thus obtained transparent supporting base member 10 provided with the diffraction grating 11 as a master block (mold) for forming a diffraction grating. Specifically, a replica having an inverted pattern may be manufactured by using the transparent supporting base member 10 provided with the diffraction grating 11 as a master block. In this case, the replica may be used as the diffraction grating 11. In addition, the step of inversion and transfer may be carried out repeatedly, and, for example, the transfer step may be repeated again by using the replica having an inverted pattern as a master block to form a child replica. A diffraction grating 11 in which first concavities and convexities are formed may be finally formed by repeating the inversion and the transfer of the concavities and convexities as described above. Note that when replicas are sequentially replicated as described above, a film may be stacked by a vapor phase method such as the vapor deposition method or the sputtering method on the surface, on which the concavity and convexity pattern is formed, of the diffraction grating (first concavity and convexity layer) used as the master block. When the film is stacked as described above, and the transfer or the like is performed by applying a resin onto a surface of the film or by other means, the adhesion with the resin (for example, a UV curable resin) can be lowered, and the master block can be easily peeled off. In addition, the vapor-deposition film may be, for example, made of a metal such as aluminum, gold, silver, platinum, or nickel or a metal oxide such as aluminum oxide. In addition, the thickness of the film is preferably 5 to 500 nm. If the thickness is less than the lower limit, a uniform film is difficult to obtain, and the sufficient adhesion-lowering effect is not obtained. If the thickness exceeds the upper limit, the shape of the master block tends to be dull. When the concavity and convexity layer of the replica is made of an UV curable resin, postcure may be conducted as appropriate by irradiation again with ultraviolet light or the like after the resin is cured.

<Microlens 12>

The microlens 12 comprises a concavity and convexity layer (second concavity and convexity layer) having second concavities and convexities formed on a surface thereof. As a material (microlens formation material) for forming the microlens (second concavity and convexity layer) 12, the same material (for example, a curable resin or a transparent inorganic layer formation material) as that used for manufacturing the diffraction grating 11 can be used as appropriate. In this way, the microlens 12 (concavity and convexity layer) may be a cured resin layer obtained by curing the resin material, or an inorganic layer formed by using a transparent inorganic layer formation material.

The thickness of the microlens (second concavity and convexity layer) 12 is preferably within a range from 1 to 500 µm. If the thickness of the concavity and convexity layer forming the microlens 12 is less than the lower limit, heights of the concavities and convexities formed on the surface of the concavity and convexity layer tend to be insufficient. Meanwhile, if the thickness of the concavity and convexity layer exceeds the upper limit, an effect of volume change of the microlens formation material (for example, a resin) which occurs upon curing tends to be so large that the formation of the concavity and convexity shape tends to be poor.

In addition, the microlens (second concavity and convexity layer) 12 needs to be such that when Fourier-transformed image is obtained by performing two-dimensional fast Fourier transform processing on a concavity and convexity analysis image obtained by analyzing the second concavity and convexity shape formed on the surface by use of an atomic force microscope, the Fourier-transformed image shows a circular or annular pattern substantially centered at an origin at which an absolute value of wavenumber is 0 $\mu m^{-1}$. By forming the shape of the concavities and convexities on the surface of the concavity and convexity layer so that the Fourier-transformed image can satisfy the above-described condition, the concavity and convexity shape becomes isotropic in any cross-sectional direction. Under such a situation, when light incident on one surface (the surface in contact with the substrate) side exits from the surface on which the shape is formed, it is possible to sufficiently reduce the angle-dependence of the emitted light and the change in chromaticity.

In addition, the circular or annular pattern of the Fourier-transformed image of the second concavity and convexity shape is preferably present within a region where an absolute value of wavenumber is within a range of 1 $\mu m^{-1}$ or less. By forming the shape of the concavities and convexities on the surface of the concavity and convexity layer so that the Fourier-transformed image can satisfy the above-described condition, the angle-dependence of the emitted light and the change in chromaticity can be sufficiently reduced at higher levels.

In addition, regarding the second concavity and convexity shape, the circular or annular pattern is preferably present within a region where an absolute value of wavenumber is within a range from 0.05 to 1 $\mu m^{-1}$, and is more preferably present within a region where an absolute value of wavenumber is within a range from 0.1 to 0.5 $\mu m^{-1}$, from the viewpoint of efficiently refracting or diffracting an emission spectrum in the visible region (380 nm to 780 nm). If the circular or annular pattern is not present within the region where the absolute value of wavenumber is within the range, that is, if the number of bright spots which form the circular or annular pattern in the Fourier-transformed image and which are present within the range is less than 30% of all bright spots, refraction effective for a lens tends not to be obtained. In addition, the pattern of the Fourier-transformed image of the second concavities and convexities is more preferably annular from the viewpoint that a sufficient effect is obtained on light having wavelengths in the visible region (380 nm to 780 nm). Note that the same method as that for obtaining the Fourier-transformed image of the shape of the first concavities and convexities can be employed as a method for obtaining this Fourier-transformed image.

In addition, an average pitch of the second concavities and convexities formed on the surface of the microlens (second concavity and convexity layer) 12 is preferably within a range from 2 to 10 μm, and more preferably within a range from 2.5 to 5 μm. If the average pitch of the concavities and convexities is less than the lower limit, not only the light extraction effect tends to deteriorate because a diffraction effect as a diffraction grating becomes stronger than a refraction effect as a lens, but also sufficient light emission tends not to be obtained at some measurement positions because the angle-dependence of the emitted light is increased. Meanwhile, if the average pitch exceeds the upper limit, a diffraction effect as a diffraction grating tends to be difficult to obtain, so that the characteristics are at the same levels as those of ordinary hemispherical lenses. Note that when a microlens has an average pitch within the above-described range in the micrometer size, a light incident angle can be made closer to the right angle in the microlens. Hence, a higher level of light extraction effect (lens effect) can be obtained, and the microlens has a more improved friction resistance than a microlens having a smaller-sized average pitch.

The average pitch of the second concavities and convexities refers to an average value of pitches of the second concavities and convexities, where pitches (distances between adjacent convex portions or between adjacent concave portions) of the second concavities and convexities on the surface of the second concavity and convexity layer are measured. In addition, a value calculated as follows is employed as the average value of pitches of the second concavities and convexities. Specifically, a concavity and convexity analysis image of the shape of the concavities and convexities on the surface is obtained by use of a scanning probe microscope (for example, one manufactured by SII NanoTechnology Inc. under the product name of "E-sweep," or the like). Then, distances between randomly selected adjacent convex portions or between randomly selected adjacent concave portions are measured at 10 points or more in the concavity and convexity analysis image, and the average of the distances is determined.

In addition, an average height of the second concavities and convexities formed on the surface of the microlens (second concavity and convexity layer) 12 is preferably within a range from 400 to 1000 nm, more preferably within a range from 600 to 1000 nm, and further preferably within a range from 700 to 900 nm. If the average height (depth) of the concavities and convexities is less than the lower limit, a refracting or diffracting effect tends not to be obtained sufficiently. Meanwhile, if the average height exceeds the upper limit, the mechanical strength tends to be lowered, so that cracks are more easily formed during production or use. Note that the average height of the concavities and convexities refers to an average value of heights of concavities and convexities, where heights of concavities and convexities (distances between concave portions and convex portions in the depth direction) on the surface of the concavity and convexity layer are measured. In addition, a value calculated as follows is employed as the average value of heights of the concavities and convexities. Specifically, a concavity and convexity analysis image of the shape of the concavities and convexities on the surface is obtained by use of a scanning probe microscope (for example, one manufactured by SII NanoTechnology Inc. under the product name of "E-sweep," or the like). Then, distances between randomly selected concave portions and convex portions in the depth direction are measured at 10 points or more in the concavity and convexity analysis image, and the average of these distances is determined. Note that the concavity and convexity shape having such a height (depth) can be formed efficiently by utilizing a method for manufacturing a microlens for an organic EL element of the present invention, which is described later.

Moreover, when intensities of emission spectra are measured for a randomly selected measuring point P on the surface on which the concavities and convexities are formed, where light L incident on the microlens on one surface side on which the concavities and convexities are not formed exits from the surface on which the concavities and convexities are formed, the microlens (second concavity and convexity layer) 12 preferably satisfies the condition represented by the following inequality (2):

$$\Sigma(y(\theta)-y_0(\theta))^2 \leq 0.05 \quad (2)$$

[in the formula, $\theta$ represents 33 measuring angles ranging from $-80°$ to $80°$ with intervals of 5 degrees, $y(\theta)$ represents values obtained by normalizing values of intensities of emission spectra measured at angles $\theta$ with respect to a value of an intensity of an emission spectrum measured at an angle of $0°$, and $y_0(\theta)$ represents values obtained by normalizing theoretical values, determined from a radiation pattern based on the Lambert law, of intensities of emission spectra at the angles $\theta$ with respect to a theoretical value, determined from the radiation pattern, of an intensity of an emission spectrum at an angle of $0°$]. Specifically, a value $[(y(\theta)-y_0(\theta))^2]$ obtained by squaring a difference between a value $(y(\theta))$ obtained by normalizing a value of an intensity of an emission spectrum measured at an angle of $\theta$ with respect to a value of an intensity of an emission spectrum measured at an angle of $0°$ and a value $(y_0(\theta))$ obtained by normalizing a theoretical value of an intensity of an emission spectra at the angle $\theta$ based on the Lambert law with respect to a theoretical value of an intensity of an emission spectrum at an angle of $0°$ based on the Lambert law is determined for each angle $\theta$, and then a total sum $(\Sigma(y(\theta)-y_0(\theta))^2)$ of these values is found. In this case, the total sum is preferably 0.05 or less. If the value of the total sum of the squares of the differences between the normalized values of the measured values and the normalized values of the theoretical values is within the above-described range, the second concavity and convexity layer shows a radiation pattern similar to a radiation pattern conforming to the Lambert law. Hence, a second concavity and convexity layer having the value of the total sum within the above-described range can be used as a microlens 12 capable of more sufficiently lowering the angle-dependence of the emitted light. Note that the total sum $(\Sigma(y(\theta)-y_0(\theta))^2)$ of the squares of the differences between the normalized values of the measured values and the normalized values of the theoretical values is more preferably 0.03 or less, and particularly preferably 0.01 or less because the angle-dependence of the emitted light and the change in chromaticity of the emitted light can be reduced at higher levels.

Figure 9:
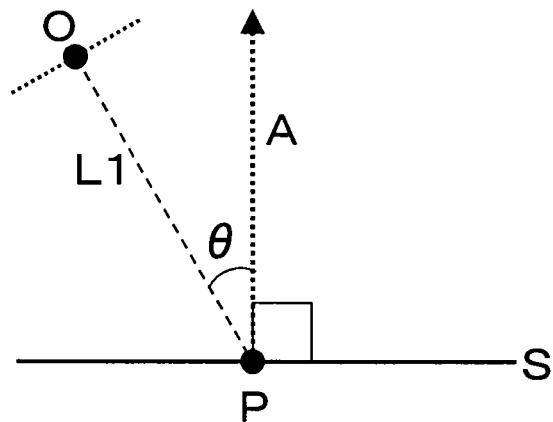
FIG. 9 is a conceptual diagram conceptually showing a measuring angle θ.

Here, description will be given of a method for determining the values (normalized values) obtained by normalizing measured values of intensities of emission spectra, and the like. For the measurement of such an intensity of an emission spectrum, a known emission spectrum measuring apparatus (for example, one manufactured by Ocean Optics under the product name of "USB-2000") capable of measuring an intensity of an emission spectrum can be used as appropriate. In addition, as a light source of the light to be incident on the concavity and convexity layer for the purpose of measuring such an intensity of an emission spectrum, an organic layer of an organic EL element may be used by stacking the light extraction transparent substrate for an organic EL element on an organic EL element. Alternatively, a lamp having an emission spectrum in the visible region, such as a xenon lamp, a halogen lamp, a metal halide lamp, a sodium lamp, a mercury lamp, a fluorescence lamp, or an LED lamp, may be used as the light source. Then, spectrum data of light having wavelengths of 450 to 700 nm are measured at 33 measurement positions at which the measuring angles are −80°, −75°, ..., −10°, −5°, 0°, 5°, 10°, ..., 75°, and 80°, respectively, where a measuring angle in a case where a measurement is conducted in a direction perpendicular to the surface of the second concavity and convexity layer 12 is defined as 0°. Then, an actual measurement value (measured value) of an intensity of an emission spectrum is determined from an integral area of the spectrum data at each angle. Thereafter, the actual measurement value (measured value) of the intensity of the emission spectrum at each angle θ is divided by the actual measurement value (measured value) of the intensity of the emission spectrum at an angle of 0° for normalization. Thus, the value (y(θ)), which is a normalized measured value of the intensity of the emission spectrum, can be obtained. Here, the measuring angle θ will be described in further detail with reference to FIG. 9. A central portion of a light-receiving surface for receiving an emission spectrum of an emission spectrum measuring apparatus (light-receiving unit) is termed as a light-receiving portion O, and a randomly selected measuring point on a surface S of the second concavity and convexity layer is termed as P. In such a case, the measuring angle θ is an angle formed by a line segment PO (line L1) connecting the light-receiving portion O and the measuring point P with respect to a direction which passes through the measuring point P and which is perpendicular to the surface S of the second concavity and convexity layer (a direction indicated by the dotted arrow A in FIG. 2, hereinafter, this is simply referred to as a "dotted line A" in some cases). In addition, for the measurement, the spectrum is measured with the distance between the measuring point P and the light-receiving portion O being set to 10 cm. While an angle formed by the dotted line A and a line L1 (line segment PO) is defined as the measuring angle θ as described above, spectrum data of light having wavelengths of 450 to 700 nm are measured at each of the 33 measurement positions. On the basis of the obtained spectrum data, an actual measurement value of an intensity of an emission spectrum (a value of integral area of a graph of a spectrum of light having wavelengths of 450 to 700 nm) is determined for each angle. Then, the actual measurement value is divided by an actual measurement value of an intensity of an emission spectrum at an angle of 0° for normalization. Thus, the normalized value (y(θ)) of the intensity of the emission spectrum can be obtained for each angle θ. Note that, in the present invention, a value (y(θ)) obtained by normalizing the value of the intensity of the emission spectrum measured at a measuring angle of 0° is 1.0. Meanwhile, the radiation pattern based on the Lambert law refers to a pattern of an angular distribution (the so-called Lambert distribution) of intensities (values of integral areas of graphs of spectra of light having wavelengths of 450 to 700 nm) of emission spectra which can be obtained theoretically from the Lambert law. Then, on the basis of the theoretical angular distribution pattern (radiation pattern) of intensities of the emission spectra obtained based on the Lambert law, theoretical values of intensities of emission spectra at the 33 measuring angles are normalized with respect to a theoretical value of an intensity of an emission spectrum at an angle of 0°. Thus, a normalized value (y$_0$(θ)) of the theoretical value of the intensity of the emission spectrum at each angle θ can be determined. Note that, in the present invention, normalized value (y$_0$(0)) of the theoretical value of the intensity of the emission spectrum at an angle of 0° is 1.0.

In addition, suppose a case where the intensities of emission spectra of light having wavelengths of 380 to 780 nm are measured for the microlens (second concavity and convexity layer) 12 by employing the same method as the above-described method for measuring the intensities of the emission spectra and the like, and then a CIE u' v' chromaticity diagram is obtained on the basis of the values of the intensities of the emission spectra. In such a case, the maximum value of the distance (Δc) between the color coordinate at a measuring angle of 0° and the color coordinate at each measuring angle is preferably 0.015 or less, preferably 0.01 or less, and further preferably 0.006 or less. If the maximum value of the color coordinate distance exceeds the upper limit, the viewing angle dependence of the color of the light emission tends to be so great that a person can notice the color change when seeing the light emission at various angles.

In addition, the microlens (second concavity and convexity layer) 12 may be stacked on the transparent supporting substrate 10 with a pressure-sensitive adhesive layer and/or an adhesive layer interposed therebetween. When the pressure-sensitive adhesive layer and/or the adhesive layer is contained as described above, the microlens (second concavity and convexity layer) 12 may be stacked on the transparent resin substrate 10, for example, by employing a method in which the microlens 12 is stacked on the transparent supporting substrate by using an adhesive agent, a method in which the microlens 12 is stacked on the transparent supporting substrate 10 by using a pressure-sensitive adhesive agent, or the like. Moreover, in this case, it is also possible to manufacture the microlens (second concavity and convexity layer) 12 in the form of an independent film, and to laminate the microlens (second concavity and convexity layer) 12 in this form as it is on the surface of the transparent resin substrate 10. In addition, in the case of such a lamination type, the yield can be improved for the following reasons. Specifically, when a scar or a defect is found in the microlens (second concavity and convexity layer) 12, such a portion can be removed. Moreover, when a defect is found on the element side, the defective part can be removed.

As a material of the pressure-sensitive adhesive layer and/or the adhesive layer, a known material (a pressure-sensitive adhesive agent or an adhesive agent) capable of adhering the microlens (second concavity and convexity layer) 12 onto the transparent supporting substrate 10 can be used as appropriate. For example, a synthetic rubber-based pressure-sensitive adhesive agent such as an acrylic pressure-sensitive adhesive agent, an ethylene-vinyl acetate copolymer, a natural rubber-based pressure-sensitive adhesive agent, polyisobutylene, butyl rubber, a styrene-butylene-styrene copolymer, or a styrene-inprene-styrene block copolymer; a polyurethane-based pressure-sensitive adhesive agent, or a polyester-based pressure-sensitive adhesive agent may be used as appropriate, or a commercially available product (an UV-curable optical adhesive agent NOA60, NOA61, NOA71, NOA72, or NOA81 manufactured by Norland Products Inc. or UV-3400 manufactured by TOAGOSEI CO., LTD.) may be used. A method for applying the pressure-sensitive adhesive agent or the adhesive agent is not particularly limited, and a known method can be employed as appropriate. Note that the pressure-sensitive adhesive agent or the adhesive agent may be applied onto either the transparent supporting substrate 10 or the microlens 12.

A protective layer is preferably stacked on the surface of the microlens (second concavity and convexity layer) 12 on which the concavity and convexity shape is formed, from the viewpoint that the friction resistance and the scratch resistance of the second concavities and convexities on the surface are improved. As the protective layer, a transparent film or a transparent inorganic vapor deposition layer may be used as appropriate. The transparent film is not particularly limited, and a known transparent film can be used as appropriate. Examples thereof include films made of transparent polymers such as polyester-based resins inducing polyethylene terephthalate; cellulose-based resins; acetate-based resins; polyether sulfone-based resins; polycarbonate-based resins; polyamide-based resins; polyimide-based resins; polyolefin-based resins; and acrylic resins. In addition, the transparent film may be used as follows. Specifically, a pressure-sensitive adhesive layer or an adhesive layer is formed on one surface of the transparent film, and the transparent film is laminated on the surface of the second concavity and convexity layer on which the second concavities and convexities are formed, with spaces being formed between convex portions. As the pressure-sensitive adhesive agent or the adhesive agent, for example, a synthetic rubber-based pressure-sensitive adhesive agent such as an acrylic pressure-sensitive adhesive agent, an ethylene-vinyl acetate copolymer, a natural rubber-based pressure-sensitive adhesive agent, polyisobutylene, butyl rubber, a styrene-butylene-styrene copolymer, or a styrene-inprene-styrene block copolymer; a polyurethane-based pressure-sensitive adhesive agent; or a polyester-based pressure-sensitive adhesive agent may be used as appropriate.

In addition, when an inorganic vapor deposition layer is stacked as the protective layer, a known metal material capable of forming a transparent inorganic layer in the vapor deposition method can be used as appropriate, and example thereof include oxides, nitrides, sulfides, and the like of metals such as Sn, In, Te, Ti, Fe, Co, Zn, Ge, Pb, Cd, Bi, Se, Ga, and Rb. In addition, $TiO_2$ can be preferably used as the metal material, from the viewpoint that deterioration due to oxidation can be prevented sufficiently. Meanwhile, ZnS can be preferably used from the viewpoint that high luminance can be obtained at low costs. In addition, a method for forming the inorganic vapor deposition layer is not particularly limited, and the inorganic vapor deposition layer may be manufactured as appropriate by using a known physical vapor deposition apparatus.

Next, a method for manufacturing a microlens 12 is described. As the method for manufacturing a microlens 12, a method (B) for manufacturing a microlens described below can be preferably employed, for example. The method (B) for manufacturing a microlens is a method comprising a step of applying a microlens formation material (for example, a resin material (a curable resin or the like) or a transparent inorganic layer formation material) onto one surface of a planate supporting material, curing the microlens formation material with a master block for forming a microlens being pressed thereto, and then detaching the master block, thereby forming a second concavity and convexity layer having concavities and convexities formed on a surface thereof.

In the method (B), a master block (mold) for forming a microlens is used. The mold only needs to be capable of forming the second concavity and convexity layer having the second concavities and convexities formed thereon as described for the microlens 12 in the following manner. Specifically, a layer made of an uncured microlens formation material is cured with the master block (mold) for forming a microlens being pressed thereto, and thus the shape of the concavities and convexities formed on the mold is transferred (inverted). Hence, as the mold, a mold having a concavity and convexity shape on a surface thereof is used, and the mold preferably has characteristics (average height, average pitch, and the like) of the concavity and convexity shape, which are the same as the characteristics of the concavities and convexities formed on the surface of the second concavity and convexity layer forming the above-described microlens 12.

In addition, a method for manufacturing the master block (mold) for forming a microlens is not particularly limited. However, it is particularly preferable to employ a method which comprises:

a step (i) of forming a vapor-deposition film under a temperature condition of 70° C. or above on a surface of a polymer film made of a polymer whose volume changes by heat, and then cooling the polymer film and the vapor-deposition film, thereby forming concavities and convexities of wrinkles on a surface of the vapor-deposition film; and a step (ii) of attaching a master block material onto the vapor-deposition film, curing the master block material, and then detaching the cured master block material from the vapor-deposition film, thereby obtaining a master block for forming a microlens.

Figure 10:
FIG. 10 is a cross-sectional view schematically showing a state where a polymer film on which a vapor-deposition film is yet to be formed is stacked on a polymer film formation substrate.
Figure 11:
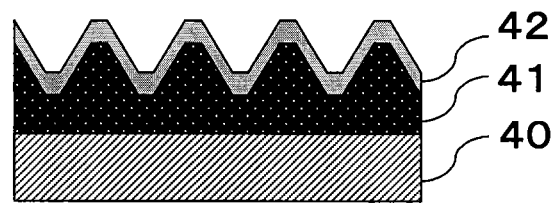
FIG. 11 is a cross-sectional view schematically showing a state where concavities and convexities of wrinkles are formed on a surface of a vapor-deposition film.
Figure 12:
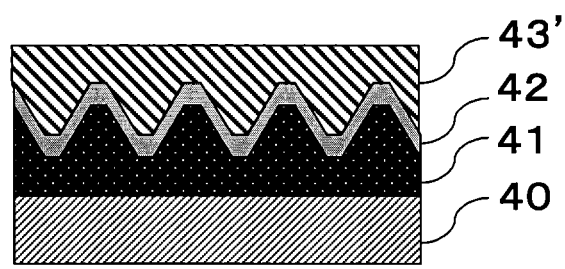
FIG. 12 is a cross-sectional view schematically showing a state where a master block material is attached onto the vapor-deposition film having the concavities and convexities formed thereon.
Figure 13:
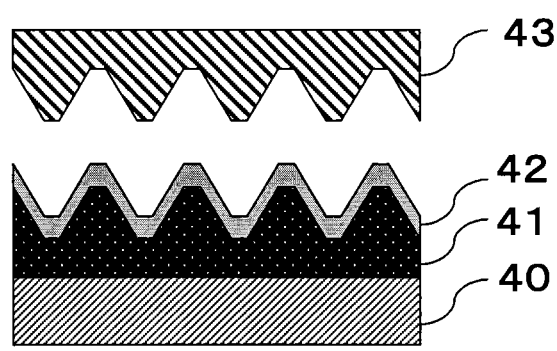
FIG. 13 is a cross-sectional view schematically showing a state where a master block obtained by curing the master block material is detached from the vapor-deposition film.

Hereinafter, the steps (i) and (ii) for obtaining a master block (mold) for forming a microlens are described with reference to FIGS. 10 to 13. Here, FIG. 10 is a cross-sectional view schematically showing a state where a polymer film 41 on which a vapor-deposition film is yet to be formed is stacked on a substrate 40 for forming a polymer film; FIG. 11 is a cross-sectional view schematically showing a state where a vapor-deposition film 42 is formed on the polymer film 41, and concavities and convexities of wrinkles are formed on a surface of the vapor-deposition film 42 by cooling the polymer film 41 and the vapor-deposition film 42; FIG. 12 is a cross-sectional view schematically showing a state where a master block material 43' is attached onto the vapor-deposition film 42 having the concavities and convexities formed thereon; and FIG. 13 is a cross-sectional view schematically showing a state where a master block 43 obtained by curing the master block material 43' is detached from the vapor-deposition film 42.

<Step (i)>

The step (i) is a step of forming a vapor-deposition film under a temperature condition of 70° C. or above on a surface of a polymer film made of a polymer whose volume changes by heat, and then cooling the polymer film and the vapor-deposition film, thereby forming concavities and convexities of wrinkles on a surface of the vapor-deposition film. In this step, first, the polymer film 41 made of a polymer whose volume changes by heat is prepared on the substrate 40 for forming a polymer film. As the polymer whose volume changes by heat, one whose volume changes by heating or cooling (for example, one having a coefficient of thermal expansion of 50 ppm/K or more) can be used as appropriate. As the polymer, a silicone-based polymer is more preferable, and a silicone-based polymer containing polydimethylsiloxane is particularly preferable, from the viewpoint that the concavities and convexities of wrinkles are easily formed on the surface of the vapor-deposition film 42, because the difference between the coefficient of thermal expansion of the polymer and the coefficient of thermal expansion of the vapor-deposition film 42 is large, and because the polymer has a high flexibility.

A method for forming the polymer film 41 is not particularly limited, and, for example, a method can be employed in which the polymer is applied onto the substrate 40 for forming a polymer film which is capable of supporting the polymer film, by employing a spin coating method, a dip coating method, a dropping method, a gravure printing method, a screen printing method, a relief printing method, a die coating method, a curtain coating method, an inkjet method, a spray coating method, a sputtering method, a vacuum vapor deposition method, or the like.

In addition, the substrate 40 for forming a polymer film is not particularly limited, and a known substrate (a glass substrate or the like) which can be used for forming a polymer film can be used as appropriate. In addition, the thickness of the thus formed polymer film 41 is preferably within a range from 10 to 5000 μm, and more preferably within a range from 10 to 2000 μm. Note that although the polymer film 41 kept stacked on the substrate 40 is used in this embodiment, the polymer film 41 may be used after detached from the substrate 40.

In addition, in the step (i), after the polymer film 41 is prepared as described above, a vapor-deposition film 42 is formed on a surface of the polymer film 41 under a temperature condition of 70° C. or above. The temperature at which the vapor-deposition film 42 is formed needs to be 70° C. or above, and is more preferably 90° C. or above. If the temperature is lower than 70° C., the concavities and convexities of wrinkles cannot be formed sufficiently on the surface of the vapor-deposition film. As the method for forming the vapor-deposition film 42, a known method such as a vapor deposition method or a sputtering method can be employed as appropriate. Of these methods, a vapor deposition method is preferably employed from the viewpoint of maintaining the shape of the concavities and convexities formed on the surface of the polymer film. In addition, a material of the vapor-deposition film 42 is not particularly limited, and examples thereof include metals such as aluminum, gold, silver, platinum, and nickel; and metal oxides such as aluminum oxide.

Moreover, in the step (i), after the vapor-deposition film 42 is formed on the surface of the polymer film 41 as described above, concavities and convexities of wrinkles are formed on the surface of the vapor-deposition film 42 by cooling the polymer film 41 and the vapor-deposition film 42 (see FIG. 11). When the polymer film 41 and the vapor-deposition film 42 are cooled after the vapor-deposition film 42 is formed on the polymer film 41 as described above, the volume of each of the polymer film 41 and the vapor-deposition film 42 changes. However, since there is a difference between the coefficient of thermal expansion of the material forming the polymer film 41 and the coefficient of thermal expansion of the material forming the vapor-deposition film 42, the layers have different volume change ratios, and hence concavities and convexities of wrinkles (the so-called bucking pattern or the so-called Turing pattern) are formed on the surface of the vapor-deposition film 42 as shown in FIG. 11. In addition, the temperatures of the polymer film 41 and the vapor-deposition film 42 after the cooling are preferably 40° C. or below. If the temperatures of the polymer film 41 and the vapor-deposition film 42 after the cooling exceed the upper limit, it tends to be difficult to form the concavities and convexities of wrinkles on the surface of the vapor-deposition film. Moreover, the rate of temperature drop in cooling the polymer film 41 and the vapor-deposition film 42 is preferably within a range from 1 to 80° C./minute. If the rate of temperature drop is less than the lower limit, the concavities and convexities tends to be relaxed. Meanwhile, if the rate of temperature drop exceeds the upper limit, scars such as cracks tend to be easily formed on the surfaces of the polymer film and the vapor-deposition film.

<Step (ii)>

The step (ii) is a step of attaching a master block material onto the vapor-deposition film, curing the master block material, and then detaching the cured master block material from the vapor-deposition film, thereby obtaining a master block for forming a microlens. In this step, first, a master block material 43' is attached onto the surface of the vapor-deposition film 42 (the surface having the concavity and convexity shape) (see FIG. 8).

The master block material 43' is not particularly limited, as long as the obtained master block is capable of maintaining the strength, hardness, and the like enough to be used as a mold for the concavity and convexity shape. Examples of the master block material 43' include inorganic substances such as nickel, silicon, silicon carbide, tantalum, glassy carbon, silica glass, and silica; resin compositions such as silicone-based polymers (silicone rubbers), urethane rubbers, norbornene resins, polycarbonates, polyethylene terephthalate, polystyrene, polymethyl methacrylate, acrylic, and liquid crystal polymers. Of these master block materials 43', silicone-based polymers, nickel, silicon, silicon carbide, tantalum, glassy carbon, silica glass, and silica are more preferable, silicone-based polymers are further more preferable, and silicone-based polymers containing polydimethylsiloxane are particularly preferable, from the viewpoints of moldability, followability to a fine pattern, and mold releasability.

In addition, a method for attaching the master block material 43' onto the surface of the vapor-deposition film 42 on which the concavity and convexity shape is formed as described above is not particularly limited, and, examples of employable methods include electroplating; a vacuum vapor deposition method; and various coating methods such as a spin coating method, a spray coating method, a dip coating method, a dropping method, a gravure printing method, a screen printing method, a relief printing method, a die coating method, a curtain coating method, an inkjet method, and a sputtering method.

In addition, in the step (ii), after the master block material 43' is attached onto the surface of the vapor-deposition film 42 as described above, the master block material 43' is cured. General conditions for curing the master block material 43' cannot be specified, because the conditions vary depending on the kind of the master block material used. However, for example, when a resin material is used, it is preferable to set a curing temperature within a range from room temperature to 250° C., and a curing time within a range from 0.5 minutes to 3 hours, depending on the kind of the material. In addition, a method may be employed in which the master block material 43' is cured by irradiation with energy rays such as ultraviolet rays or electron beams, depending on the kind of the master block material 43'. In such a case, the amount of irradiation is preferably within a range from 20 mJ/cm$^2$ to 10 J/cm$^2$.

In addition, in the step (ii), after the master block material 43' on the surface of the vapor-deposition film 42 is cured as described above, a master block 43 for forming a microlens is obtained by detaching a layer 43 obtained by curing the master block material 43' from the vapor-deposition film 42 as shown in FIG. 13. A method for detaching the master block 43 from the vapor-deposition film 42 as described above is not particularly limited, and a known method can be employed as appropriate.

Moreover, from the viewpoint that the second concavities and convexities can be formed more efficiently, the following first to fifth steps may further be carried out by using the master block 43 obtained by caring out the steps (i) and (ii):

a first step of applying a curable resin onto one surface of a supporting material, curing the curable resin with the master block 43 being pressed thereto, and detaching the master block 43, thereby obtaining a first concavity and convexity resin film being located on the supporting material and having concavities and convexities formed thereon;

a second step of applying a polymer whose volume changes by heat onto a surface of the first concavity and convexity resin film, curing the polymer, and then detaching the cured polymer film, thereby obtaining a second polymer film having concavities and convexities formed on a surface thereof;

a third step of forming a vapor-deposition film under a temperature condition of 70° C. or above on the surface on which the concavities and convexities are formed, and then cooling the polymer film and the vapor-deposition film to form concavities and convexities of wrinkles on a surface of the vapor-deposition film, thereby obtaining a laminate;

a fourth step of applying a curable resin onto one surface of another supporting material to obtain a coating film, then curing the curable resin with the concavity and convexity surface of the laminate being pressed to the coating film, and detaching the laminate, thereby obtaining a second concavity and convexity resin film being located on the supporting material and having concavities and convexities formed thereon; and a fifth step of attaching a master block material onto the second concavity and convexity resin film, curing the master block material, and then detaching the cured master block material from the vapor-deposition film, thereby obtaining a master block. In addition, it is also possible to repeat the first to fifth steps by using the master block obtained in the fifth step. Alternatively, after the first to fifth steps are cared out, it is also possible to repeat only the third to fifth steps by using the concavity and convexity surface of the master block obtained in the fifth step as the surface on which the concavities and convexities are formed described in the third step. In addition, the concavity and convexity resin film obtained in the second step or the fourth step may be used as a master block. When a master block in which the shape of the concavities and convexities formed in the master block 43 is sequentially replicated (inverted or transferred) is manufactured by repeating the first to fifth steps, by repeating part of the first to fifth steps after the first to fifth steps are carried out, by caring out part of the first to fifth steps, or by other means, the wrinkles can be deepened every time the vapor deposition step is repeated. Hence, the average height of the concavities and convexities formed on the surface of the master block can be increased. In addition, a microlens having higher performances can be formed by using a master block whose average height of the concavities and convexities is increased as described above as a master block for forming a microlens. Note that how many times the steps for replicating the concavity and convexity shape formed on the first master block (for example, the first to fifth steps) are repeated, what steps are repeated, and the like can be changed as appropriate depending on the intended design (the pitches and the heights (depth) of concavities and convexities) of the concavity and convexity shape, the kind of material used, and the like. Thus, the characteristics of the concavities and convexities can be adjusted more easily, so that the same characteristics as those of the above-described second concavities and convexities can be achieved.

In addition, the same polymer as described in the step (i) can be used as the polymer whose volume changes by heat used in each of the first step and the second step. In addition, as the curable resin used in the first step and the second step, the same resin material (curable resin) as that used in the formation of the above-described first concavity and convexity layer can be used as appropriate. In addition, the supporting material is not particularly limited, as long as the curable resin can be applied onto the supporting material, and can be supported thereon. A known base material can be used as appropriate, and examples thereof include base materials including substrates of resins such as polyimide, polyphenylene sulfide, polyphenylene oxide, polyether ketone, polyethylene naphthalate, polyethylene terephthalate, polyarylate, triacetyl cellulose, and polycycloolefin; inorganic substrates such as glass and silicon substrates; and substrates of metals such as aluminum, iron, and copper; and the like. Moreover, the method for applying the curable resin, the method for curing the curable resin, and the like are not particularly limited, and the above-described method for applying the resin material (curable resin) and the above-described method for curing the resin material (curable resin) can be employed as appropriate. Moreover, the third step is the same as the step described in the above-described concavity and convexity shape formation step, except that the polymer film obtained in the second step is used. In addition, as the curable resin used in each of the fourth step and the fifth step, the same resin material (curable resin) as that used for forming the above-described first concavity and convexity layer can be used as appropriate. Moreover, the same master block material as that described in the step (ii) or the like can be used as the master block material used in each of the fourth step and the fifth step, and the same methods as those described for the step (ii) and the like may be employed as the method for applying the master block material and the like.

In addition, when a polymer whose volume changes by heat is used as the master block material in the method for manufacturing a master block 43 for forming a microlens, the steps (i) and (ii) may be repeated by using the obtained master block as the polymer film. Also by such a method, wrinkles formed on the surface of the master block can be deepened, and the average height of the concavities and convexities formed on the surface of the master block can be increased.

Note that, in the method for manufacturing the master block 43 for forming a microlens, a desired concavity and convexity shape can be easily formed by changing, as appropriate, the kind of the resin used, the steps to be repeated, and the like depending on the intended design of the concavity and convexity structure.

Hereinabove, the method for manufacturing a master block (mold) for forming a microlens comprising the steps (i) and (ii) is described. However, the method for manufacturing a master block (mold) for forming a microlens is not particularly limited, and a known method can be employed as appropriate. For example, a master block (mold) for forming a microlens, the master block having desired concavities and convexities formed thereon, may be manufactured by employing a method similar to the above described method for manufacturing a master block (mold) for forming a diffraction grating. Note that, likewise, a method in which the steps (i) and (ii) are carried out may be employed as the method for manufacturing a master block (mold) for forming a diffraction grating.

Next, description is given of a step (microlens formation step) in which the obtained mold for forming a microlens is used. Specifically, in this step, a microlens formation material (for example, a resin material (a curable resin) or a transparent inorganic layer formation material) is applied onto one surface of a planate supporting material, and is cured with a master block for forming a microlens being pressed thereto. Then, the master block is detached, so that a second concavity and convexity layer having concavities and convexities formed on a surface thereof is formed.

In the microlens formation step, first, a microlens formation material (for example, a curable resin) is applied onto one surface of the planate supporting material, and is cured with the master block for forming a microlens being pressed thereto. This step is basically the same as the above-described step of manufacturing a diffraction grating, except that the master block for forming a microlens is used instead of the master block for forming a diffraction grating.

As the microlens formation material, the same material as the material for forming the first concavity and convexity layer (diffraction grating formation material) can be used as appropriate. In addition, the planate supporting material is not particularly limited, as long as the microlens formation material can be applied onto the planate supporting material, and can be supported thereon. A known base material (for example, a glass base material, a resin film (a film of TAC, PET, COP, PC, or the like), or the like) can be used as appropriate. In addition, it is also possible to preferably use the transparent supporting substrate 10 for an organic EL element as the supporting material. When the transparent supporting substrate 10 is used as the supporting material as described above, the microlens (second concavity and convexity layer) can be directly used for manufacturing the light extraction transparent substrate for an organic EL element without peeling the microlens from the supporting material. Thus, the step of manufacturing an organic EL element can be simplified. Particularly when a substrate in which the diffraction grating 11 is formed on the transparent supporting substrate 10 is used as the supporting material, the substrate can be used directly as the light extraction transparent substrate for an organic EL element. In addition, a microlens is obtained in a state of being stacked on a resin film (a film of TAC, PET, COP, PC, or the like) used as the supporting material, and the film in the stacked state may be stacked on the transparent supporting substrate 10. In addition, the thickness of the supporting material is not particularly limited, and is preferably within a range from 1 to 500 μm.

Subsequently, in the microlens formation step, a microlens comprising a second concavity and convexity layer is obtained by detaching the master block for forming a microlens form the cured layer. A method for detaching the master block from the cured concavity and convexity layer (a layer obtained by curing the microlens formation material, for example, a cured resin layer or the like) as described above is not particularly limited, and a known method can be employed as appropriate. Thus, a microlens comprising the second concavity and convexity layer having the second concavities and convexities formed thereon can be obtained on the supporting material. Note that, after the microlens is formed as described above, the light extraction transparent substrate for an organic EL element may be manufactured by peeling the microlens from the supporting material, and stacking the peeled microlens on the transparent supporting substrate 10 with a pressure-sensitive adhesive layer and/or an adhesive layer interposed therebetween. Alternatively, when the transparent supporting substrate 10 is used as the supporting material, the microlens may be directly used for manufacturing the light extraction transparent substrate without peeling the microlens. Moreover, when a transparent resin film or the like is used as the supporting material, the film on which the microlens is stacked may also be directly stacked on the transparent supporting substrate 10.

In addition, a method for manufacturing the light extraction transparent substrate comprising the transparent supporting substrate 10, the diffraction grating 11, and the microlens 12 is not particularly limited, and, for example, it is possible to employ a method in which a separately manufactured microlens 12 is stacked on a transparent supporting substrate 10 on which a diffraction grating 11 is stacked, a method in which a microlens 12 is manufactured directly on another surface of a transparent supporting substrate 10 on which a diffraction grating 11 is stacked in advance, or a method in which a diffraction grating 11 is manufactured directly on another surface of a transparent supporting substrate 10 on which a microlens 12 is stacked in advance.

When the light extraction transparent substrate 1 of the present invention as described above is used for an organic EL element, a surface 10A of the transparent supporting substrate 10 on which the diffraction grating 11 is formed is arranged on a surface (incident surface) side on which light L from the organic EL element is incident, and a surface 10B of the transparent supporting substrate 10 on which the microlens 12 is formed is arranged on a surface (emitting surface) side on which the light L from the organic EL element exits. By using the light extraction transparent substrate 1 in this manner, light from the organic EL can be extracted more efficiently.

In addition, since the diffraction grating 11 and the microlens 12 are used in combination in the light extraction transparent substrate 1, the light emission efficiency can be improved sufficiently without increasing the average height of the concavities and convexities of the diffraction grating. Hence, life-shortening of the organic EL element can be sufficiently suppressed, and also the guided light can be sufficiently extracted. Moreover, by the light extraction transparent substrate 1, the light emission efficiency can be improved sufficiently, while the angle-dependences of luminance and chromaticity are sufficiently reduced.

Hereinabove, description is given of a preferred embodiment of the light extraction transparent substrate for an organic EL element of the present invention. However, the light extraction transparent substrate for an organic EL element of the present invention is not limited to the embodiment. For example, in the embodiment shown in FIG. 1, the light extraction transparent substrate for an organic EL element comprises the transparent supporting substrate 10, the diffraction grating 11, and the microlens 12. However, unless effects of the invention are impaired, an adhesive layer, a pressure-sensitive adhesive layer, a transparent resin layer (for example, a resin film usable for an organic EL element (a film of TAC, PET, COP, PC, or the like, etc.): note that the resin film used as the supporting material in manufacturing the microlens, as it is, may be used as the transparent resin layer), or the like may be arranged between the transparent supporting substrate 10 and the diffraction grating 11 or between the transparent supporting substrate 10 and the microlens 12. For example, a lamination structure such as a light extraction transparent substrate 1 in an organic EL element shown in FIG. 14 and described later may be employed.

(Organic EL Element)

Next, an organic EL element of the present invention is described. Specifically, the organic EL element of the present invention comprises:

a transparent supporting substrate;

a diffraction grating comprising a first concavity and convexity layer which is disposed on one surface of the transparent supporting substrate and which has first concavities and convexities formed on a surface thereof;

a microlens comprising a second concavity and convexity layer which is disposed on another surface of the transparent supporting substrate and which has second concavities and convexities formed on a surface thereof; and a transparent electrode, an organic layer, and a metal electrode, which are stacked in this order on the first concavity and convexity layer, while being formed into such shapes that a shape of the first concavities and convexities formed on the surface of the first concavity and convexity layer is maintained, wherein a constituent unit formed by the transparent supporting substrate, the diffraction grating, and the microlens comprises the above-described light extraction transparent substrate for an organic EL element of the present invention.

Figure 14:
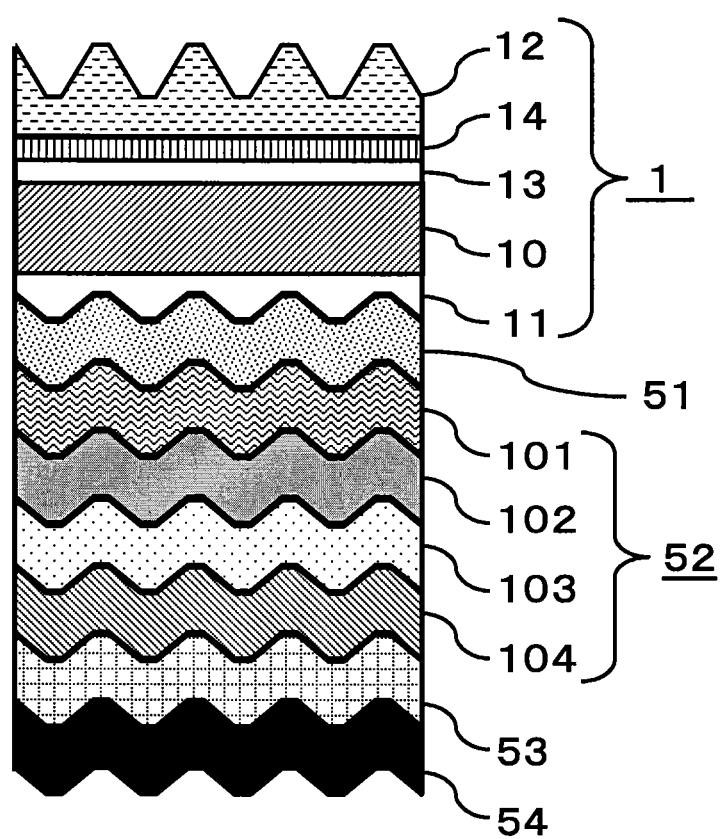
FIG. 14 is a cross-sectional view schematically showing a preferred embodiment of an organic EL element of the present invention.

Hereinafter, a preferred embodiment of the organic EL element of the present invention will be described in detail with reference to the drawings. FIG. 14 is a cross-sectional view schematically showing the preferred embodiment of the organic EL element of the present invention. The organic EL element shown in FIG. 14 basically comprises: a light extraction transparent substrate 1; a transparent electrode 51; an organic layer 52; a cathode buffer layer 53; and a metal electrode 54.

As the light extraction transparent substrate 1, the above-described light extraction transparent substrate of the present invention is used. Note that, in the light extraction transparent substrate 1 used in this embodiment, the microlens 12 is stacked on a surface of the transparent supporting substrate 10 on an emitting surface side in an organic EL element with an adhesive layer 13 and a transparent resin layer 14 interposed therebetween, and the diffraction grating 11 is stacked on another surface thereof. The stacking structure between the microlens 12 and the transparent supporting substrate 10 can be easily achieved as follows. Specifically, a transparent resin film is used as a planate supporting substrate for manufacturing the microlens 12, and an adhesive layer is formed on another surface of the transparent resin film in advance. Then, these are laminated on the transparent supporting substrate 10.

In addition, the average height of the concavities and convexities formed on the diffraction grating in the light extraction transparent substrate 1 is preferably 20% to 80% of the entire thickness of the organic layer 52 of the organic EL element. If the average height of the concavities and convexities is less than the lower limit (less than 20%), the average height of the concavities and convexities is so insufficient that a sufficient diffraction effect tends not to be obtained. Meanwhile, if the average height exceeds the upper limit (if the average height of the concavities and convexities is larger than 80% of the thickness of the organic layer), the possibilities of occurrence of defects such as short circuit between the anode and the cathode and insulation breakdown of the light emitting layer; light emission failure; life shortening; and the like tend to be high.

In addition, in the organic EL element shown in FIG. 14, the transparent electrode 51, the organic layer 52 (hole transporting layer 101/light emitting layer 102/hole blocking layer 103/electron transporting layer 104), the cathode buffer layer 53, and the metal electrode 54 are stacked in this order on the surface of the light extraction transparent substrate 1 on which the first concavities and convexities of the diffraction grating (first concavity and convexity layer) 11 are formed, while being formed into such shapes that the shape of the first concavities and convexities is maintained.

As a material for the transparent electrode 51, for example, indium oxide, zinc oxide, tin oxide, indium-tin oxide (ITO), which is a composite material thereof, gold, platinum, silver, or copper is used. Of these materials, ITO is preferable from the viewpoint of the balance between the transparency and the electrical conductivity. In addition, the thickness of the transparent electrode 51 is preferably within a range from 20 to 500 nm. If the thickness is less than the lower limit, the electrical conductivity tends to be insufficient. Meanwhile, if the thickness exceeds the upper limit, the transparency tends to be so insufficient that the emitted EL light cannot be extracted to the outside sufficiently.

In the organic EL element shown in FIG. 14, the organic layer 52 is a laminate comprising the hole transporting layer 101, the light emitting layer 102, the hole blocking layer 103, and the electron transporting layer 104. A material for each of the hole transporting layer 101, the light emitting layer 102, the hole blocking layer 103, and the electron transporting layer 104 is not particularly limited, and a known material can be used as appropriate. Example of materials usable for the hole transporting layer 101 include derivatives of naphthyldiamine (α-NPD), triphenylamine, triphenyldiamine derivatives (TPD), benzidine, pyrazoline, styrylamine, hydrazone, triphenylmethane, carbazole, and the like, etc. As a material of the light emitting layer 102, for example, a known material which emits light upon application of a voltage can be used as appropriate. Here, examples of the material which emits light upon application of a voltage include a material obtained by doping 4,4'-N,N'-dicarbazole-biphenyl (CBP) with tris(phenylpyridinato)iridium(III) complex (Ir(ppy)$_3$); materials made of fluorescent organic solids such as 8-hydroxyquinoline aluminum (Alq$_3$, green, low molecular weight), bis-(8-hydroxy)quinaldine aluminum phenoxide (Alq'$_2$OPh, blue, low molecular weight), 5,10,15,20-tetraphenyl-21H,23H-porphine (TPP, red, low molecular weight), poly(9,9-dioctylfluorene-2,7-diyl) (PFO, blue, high molecular weight), poly[2-methoxy-5-(2'-ethylhexyloxy)-1,4-(1-cyanovinylene)phenylene] (MEH-CN-PPV, red, high molecular weight), and anthracene; and the like. In addition, as the hole blocking layer 103, a material (for example, 9-dimethyl-4,7-diphenyl-1,10-phenanthroline (BCP) or the like) known as the so-called hole blocking material can be used as appropriate. Moreover, aluminum quinolinol complex, a phenanthroline derivative, an oxadiazole derivative, a triazole derivative, a phenylquinoxaline derivative, a silole derivative, or the like can be used as a material of the electron transporting layer 104.

In addition, in the organic layer 52, the thicknesses of the hole transporting layer 101, the light emitting layer 102, the hole blocking layer 103, and the electron transporting layer 104 are preferably within a range from 5 to 200 nm (the hole transporting layer 101), within a range from 5 to 200 nm (the light emitting layer 102), within a range from 1 to 50 nm (the hole blocking layer 103), and within a range from 5 to 200 nm (the electron transporting layer 104), respectively, from the viewpoint of maintaining the shape of the concavities and convexities formed on the surface of the concavity and convexity layer. In addition, the entire thickness of the organic layer 52 is preferably within a range from 20 to 600 nm.

In addition, a metal fluoride such as lithium fluoride (LiF) or Li$_2$O$_3$, a highly active alkaline earth metal such as Ca, Ba, or Cs, or the like can be used as a material of the cathode buffer layer 53. The thickness of the cathode buffer layer 53 is preferably within a range from 0.5 to 10 nm.

Meanwhile, the metal electrode 54 is an electrode made of a metal. A material of the metal electrode 54 is not particularly limited, and a substance having a small work function can be used as appropriate. Examples thereof include aluminum, MgAg, MgIn, and AlLi. In addition, the thickness of the metal electrode 54 is preferably within a range from 50 to 500 nm. If the thickness is less than the lower limit, the electrical conductivity tends to decrease. Meanwhile, if the thickness exceeds the upper limit, the concavity and convexity shape tends to be difficult to maintain.

In the organic EL element of the present invention, the transparent electrode 51, the organic layer 52, the cathode buffer layer 53, and the metal electrode 54 are each stacked on the surface of the first concavity and convexity layer of the diffraction grating, while being formed into such a shape that the shape of the first concavities and convexities formed on the surface of the first concavity and convexity layer of the diffraction grating is maintained. Hence, stress generated when the organic EL element is bent can be relaxed by the shape of the concavities and convexities. For this reason, the organic EL element of the present invention can be suitably used as an organic EL element for flexible displays, flexible lighting apparatuses, and the like, for which flexibility is required.

Figure 15:
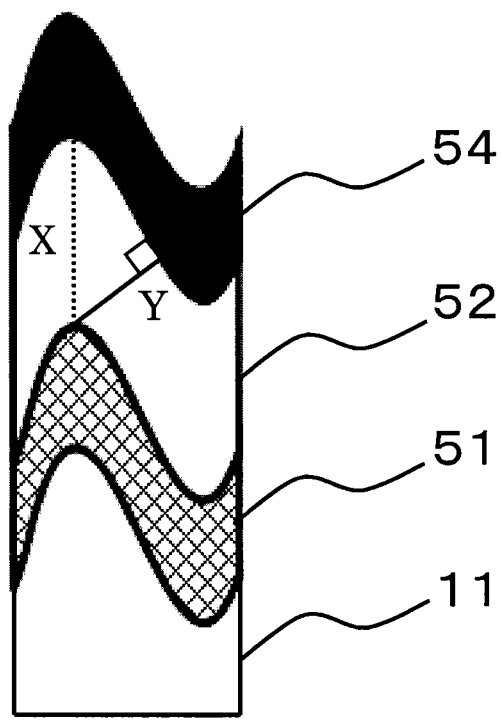
FIG. 15 is a schematic diagram conceptually showing the relationship between the shortest distance and the standard distance between a transparent electrode and a metal electrode.

In addition, in the organic EL element of the present invention, part of constituent portions of the organic EL element is constituted of the light extraction transparent substrate 1 as described above. In such an organic EL element, the diffraction grating 11 in the light extraction transparent substrate 1 more preferably satisfy the condition represented by the above-described inequality (1) and/or the condition that the kurtosis (k) is −1.2 or more (more preferably −1.2 to 1.2), from the viewpoint of more sufficiently suppressing the generation of a leakage current. Suppose that a light extraction transparent substrate 1 comprising a diffraction grating (first concavity and convexity layer) 11 satisfying such a condition is used, and suppose that the shape of the first concavities and convexities formed on the surface of the diffraction grating (first concavity and convexity layer) 11 is maintained as it is in each of the transparent electrode 51, the organic layer 52, and the metal electrode 54 (note that the cathode buffer layer 53 is not shown in FIG. 15) as shown in FIG. 15 (suppose that each of the layers has a uniform thickness in a direction perpendicular to the surface of the transparent electrode substrate). In such a case, regarding an inter-electrode distance between the transparent electrode 51 and the metal electrode 54 in the direction perpendicular to the surface of the transparent electrode substrate (standard distance: the distance represented by X in FIG. 15) and a distance at which an inter-electrode distance between the transparent electrode 51 and the metal electrode 54 is the shortest (the shortest distance: the distance represented by Y in FIG. 15), which are determined on the basis of the concavity and convexity analysis image of the first concavity and convexity layer 11, the ratio of measuring points at which the magnitude of the shortest distance Y is a half or less of the standard distance X can be made 0 to 2% relative to all the measuring points in the concavity and convexity analysis. Note that the present inventors have found that such regions where the magnitude of the shortest distance Y is a half or less of the standard distance X are prone to generation of a leakage current. The present inventors have found, on the basis of this knowledge, that by making the ratio of the regions where the magnitude of the shortest distance Y is a half or less of the standard distance X 0 to 2%, the generation of a leakage current can be suppressed sufficiently. Note that the ratio of the regions (measuring points) where the magnitude of the shortest distance Y is a half or less of the standard distance X relative to all the regions (all the measuring points) is herein referred to as "the ratio of the presence of leakage-current prone regions."

As described above, in the organic EL element of the present invention, the ratio of measuring points where the magnitude of the shortest distance Y is a half or less of the standard distance X (the ratio of the presence of leakage-current prone regions) is preferably 0 to 2% relative to all the measuring points in the concavity and convexity analysis image, from the viewpoint of sufficiently suppressing the leakage current. Here, the ratio is determined from a distribution of the inter-electrode distance, and this distribution of the inter-electrode distance is determined on the basis of a concavity and convexity analysis image obtained by measuring the first concavity and convexity layer 11 by employing the same method as the method for measuring the median (M) and the average value (m) of the depth distribution, on the assumption that the shape of the concavities and convexities formed on the surface of the first concavity and convexity layer 11 is maintained as it is in each of the transparent electrode 51, the organic layer 52, and the metal electrode 54. Specifically, in the organic EL element of the present invention, the ratio of the presence of leakage-current prone regions determined from the distribution of the inter-electrode distance between the transparent electrode 51 and the metal electrode 54 is preferably 0 to 2%. Note that, in the measurement of the distribution of the inter-electrode distance, the standard distance X is preferably set (assumed) to be within a range from 30 to 500 nm to meet the actual design, and, for example, the standard distance X is assumed to be 70 nm for an organic EL element in which the thickness of the organic layer in the direction perpendicular to the transparent supporting substrate is 70 nm. Then, the distribution of the shortest distance is calculated on the basis of the concavity and convexity analysis image (SPM image), and the ratio of the regions (leakage-current prone regions) where the shortest distance Y of the inter-electrode distance is a half or less of the standard distance X relative to all the measuring points in the measurement of the concavity and convexity analysis image (SPM image) is calculated. Thus, the ratio of the presence of the leakage-current prone regions can be determined. Note that the calculation of the shortest distance and the ratio of the presence of the leakage-current prone regions can be determined by calculation with a computer on the basis of analysis results of the concavity and convexity analysis image of the diffraction grating (first concavity and convexity layer) 11.

In addition, since each of the transparent electrode 51, the organic layer 52, the cathode buffer layer 53, and the metal electrode 54 is stacked in the organic EL element of the present invention, while being formed into such shapes that the shape of the first concavities and convexities formed on the surface of the diffraction grating (first concavity and convexity layer) 11 is maintained, it is possible to suppress the repetition of multiple reflections of light generated at the organic layer in the element due to total reflection at each interface. In addition, it is also possible to re-emit light, which has been reflected at an interface between the transparent supporting substrate and the microlens 12, by a diffraction effect. Moreover, since each of the transparent electrode 51, the organic layer 52, and the metal electrode 54 is stacked, while being formed into such a shape that the shape of the first concavities and convexities formed on the surface of the diffraction grating (first concavity and convexity layer) 11 is maintained, the inter-electrode distance between the transparent electrode 51 and the metal electrode 54 is short in some portions as described above. For this reason, in comparison with those in which the inter-electrode distance between the transparent electrode 51 and the metal electrode 54 is uniform, an increase in electric field intensity can be expected in application of a voltage, and also the light emission efficiency of the organic EL element can be improved. In addition, if a control is made so that the leakage-current prone regions can be 0 to 2%, the leakage current can also be sufficiently prevented, and the light emission efficiency of the organic EL element can be further improved. As described above, according to the organic EL element of the present invention, it is possible to achieve a sufficient external extraction efficiency.

In addition, in the organic EL element of the present invention, the microlens 12 is disposed on one surface of the transparent supporting substrate 10. In the microlens 12, the shape of the second concavities and convexities (such a shape that when a Fourier-transformed image is obtained by performing two-dimensional fast Fourier trans form processing on a concavity and convexity analysis image obtained by analyzing the shape by use of an atomic force microscope, the Fourier-transformed image shows a circular or annular pattern substantially centered at an origin at which an absolute value of wavenumber is 0 µm$^{-1}$) is formed. Hence, the concavities and convexities have a concavity and convexity shape isotropic in any cross-sectional direction. For this reason, not only the light extraction efficiency can be sufficiently high, but also light can be sufficiently stably emitted in every angle. Hence, the angle-dependence of the emitted light and the change in chromaticity can be sufficiently reduced.

Note that a method for manufacturing the organic EL element of the present invention is not particularly limited, and, for example, the organic EL element may be manufactured by employing a method for manufacturing an organic EL element described below. Specifically, as the method for manufacturing an organic EL element, a method may be employed which comprises: a step of preparing the above-described light extraction transparent substrate for an organic EL element of the present invention; and a step (organic EL element formation step) of stacking, on a surface of the first concavity and convexity layer (diffraction grating) of the light extraction transparent substrate for an organic EL element, each of the transparent electrode, the organic layer, and the metal electrode, which are formed into such shapes that the shape of the first concavities and convexities formed on the surface of the first concavity and convexity layer is maintained, thereby obtaining an organic EL element. Hereinafter, each of the steps is described, with a case where an organic EL element of the embodiment shown in FIG. 14 is manufactured being taken as an example.

As the step of preparing the above-described light extraction transparent substrate for an organic EL element of the present invention, the method for manufacturing a light extraction transparent substrate described above for the light extraction transparent substrate for an organic EL element of the present invention can be employed as appropriate.

Subsequently, in the organic EL element formation step, first, a transparent electrode 51 is stacked on a diffraction grating (first concavity and convexity layer) 11 as shown in FIG. 14, while being formed into such a shape that the shape of the first concavities and convexities formed on the surface of the first concavity and convexity layer 11 is maintained. As a material of the transparent electrode 51, the same materials as those described as the materials of the transparent electrode 3 in the organic EL element of the present invention can be used. In addition, as a method for stacking the transparent electrode 51, a known method such as a vapor deposition method or a sputtering method can be employed as appropriate. Of these methods, a vapor deposition method is preferably employed from the viewpoint of maintaining the shape of the first concavities and convexities formed on the surface of the first concavity and convexity layer.

In addition, in the organic EL element formation step, next, an organic layer 52 is stacked on the transparent electrode 51 as shown in FIG. 14, while being formed into such a shape that the shape of the first concavities and convexities formed on the surface of the first concavity and convexity layer 11 is maintained. As the kind and material of the organic layer 52, the same kind and material as those described above for the organic layer of the organic EL element of the present invention can be used. In addition, the organic layer 52 may have a structure of the laminate comprising the hole transporting layer 101/the light emitting layer 102/the hole blocking layer 103/the electron transporting layer 104 as shown in FIG. 14 (the sign "/" indicates that the adjacent layers are stacked on each other), for example. In addition, as a method for stacking the organic layer 52, a known method such as a vapor deposition method or a sputtering method can be employed as appropriate. Of these methods, a vapor deposition method is preferably employed from the viewpoint of maintaining the shape of the first concavities and convexities formed on the surface of the first concavity and convexity layer 11.

When the organic EL element shown in FIG. 14 is manufactured, subsequently, a cathode buffer layer 53 and a metal electrode 54 are stacked on the organic layer 52, while being formed into such shapes that the shape of the first concavities and convexities formed on the surface of the first concavity and convexity layer 11 is maintained, in the organic EL element formation step. As materials of the cathode buffer layer 53 and the metal electrode 54, the same materials as those described above for the organic EL element of the present invention can be used. In addition, as a method for stacking each of the cathode buffer layer 53 and the metal electrode 54, a known method such as a vapor deposition method or a sputtering method can be employed as appropriate. Of these methods, a vapor deposition method is preferably employed from the viewpoint of maintaining the shape of the first concavities and convexities formed on the surface of the first concavity and convexity layer 11.

In addition, the method for manufacturing the organic EL element is not limited to the above-described method, and the following method may be employed. Specifically, a diffraction grating is formed on a transparent supporting base member. Then, a laminate of a transparent supporting base member 10, a diffraction grating 11, a transparent electrode 51, an organic layer 52, a cathode buffer layer 53, and a metal electrode 54 is obtained by subjecting the diffraction grating to the above-described organic EL element formation step. After that, a separately manufactured microlens 12 is laminated thereon. When such a method is employed, the final yield of the manufacturing of the organic EL element can also be improved for the following reasons. Specifically, when a scar or a defect is found in the microlens (second concavity and convexity layer) 12, such a portion can be removed. Moreover, when a defect is found on the element side, the defective part can be removed.

The organic EL element obtained according to the method for manufacturing an organic EL element of the present invention as described above has a sufficiently high light extraction efficiency, and is capable of sufficiently stably emitting light in every angle and sufficiently reducing the angle-dependence of the emitted light and the change in chromaticity.

Hereinabove, the preferred embodiment of the organic EL element of the present invention is described. However, the organic EL element of the present invention is not limited to the above-described embodiment. For example, although the organic layer 52 of the embodiment shown in FIG. 14 has the following structure (A):
(A) hole transporting layer 101/light emitting layer 102/hole blocking layer 103/electron transporting layer 104 (the sign "/" indicates that the adjacent layers are stacked on each other), the structure of the organic layer 52 is not particularly limited. A known structure of an organic layer of an organic EL element can be employed as appropriate. For example, the organic layer may have any of the following structures (B) to (E):
(B) light emitting layer/electron transporting layer,
(C) hole transporting layer/light emitting layer/electron transporting layer,
(D) hole transporting layer/light emitting layer/hole blocking layer/electron transporting layer, and
(E) hole transporting layer/electron transporting layer.

Moreover, the cathode buffer layer is stacked in the structure of the embodiment shown in FIG. 14. However, the organic EL element of the present invention only needs to comprise the above-described light extraction transparent substrate for an organic EL element of the present invention, a transparent electrode, an organic layer, and a metal electrode. The other constituents are not particularly limited, and it is not necessary to stack the cathode buffer layer. In addition, from the same viewpoint, an anode buffer layer may be further stacked between the transparent electrode 51 and the organic layer in the organic EL element of the present invention. As a material of the anode buffer layer, a known material can be used as appropriate, and examples thereof include copper phthalocyanine, PEDOT, and the like. In addition, the thickness of the anode buffer layer is preferably 1 to 50 nm. Moreover, a manufacturing method for a case where the anode buffer layer is used is not particularly limited, and a known method capable of manufacturing an anode buffer layer can be employed as appropriate.

EXAMPLES

Hereinafter, the present invention is described more specifically on the basis of Example and Comparative Examples. However, the present invention is not limited to Example below.

First, a block copolymer 1 used in Example and Comparative Example below is described. In the block copolymer 1, polystyrene (hereinafter, abbreviated as "PS" as appropriate) was used as a first polymer segment, and polymethyl methacrylate (hereinafter, abbreviated as "PMMA" as appropriate) was used as a second polymer segment. The volume ratio of the first and second polymer segments (first polymer segment:second polymer segment) in the block copolymer was calculated on the assumption that the density of polystyrene was 1.05 g/cm$^3$, and the density of polymethyl methacrylate was 1.19 g/cm$^3$. The number average molecular weights (Mn) and weight average molecular weights (Mw) of the polymer segments and the polymer were measured by gel permeation chromatography (Model No: "GPC-8020" manufactured by Tosoh Corporation, in which TSK-GEL SuperH1000, SuperH2000, SuperH3000, and SuperH4000 were connected in series). The glass transition temperatures (Tg) of the polymer segments were measured by using a differential scanning calorimeter (manufactured by Perkin-Elmer under the product name of "DSC7"), while the temperature was raised at a rate of temperature rise of 20° C./min over a temperature range from 0 to 200° C. The solubility parameters of polystyrene and polymethyl methacrylate are 9.0 and 9.3, respectively (see Kagaku Binran Ouyou Hen (Handbook of Chemistry, Applied Chemistry) 2nd edition).

<Block Copolymer 1>
A block copolymer of PS and PMMA (manufactured by Polymer Source Inc),
Mn of PS segment=868,000,
Mn of PMMA segment=857,000,
Mn of block copolymer=1,725,000
Volume ratio of PS segment to PMMA segment (PS:PMMA)=53:47,
Molecular weight distribution (Mw/Mn)=1.30,
Tg of PS segment=96° C.,
Tg of PMMA segment=110° C.

<Method for Measuring Concavity and Convexity Shape>
A method for measuring a concavity and convexity shape is described. Specifically, first, for each of concavity and convexity shapes formed in diffraction gratings and microlenses of Example etc., a randomly s elected measuring region of 3 μm square (length: 3 μm, width: 3 μm) was analyzed by use of an atomic force microscope (a scanning probe microscope equipped with an environment control unit "Nanonavi II Station/E-sweep" manufactured by SII NanoTechnology Inc.) under the following analysis conditions:
Measurement mode: dynamic force mode
Cantilever: SI-DF40 (material: Si, lever width: 40 μm, diameter of tip of chip: 10 nm)
Measurement atmosphere: in air
Measurement temperature: 25° C.

Thus, a concavity and convexity analysis image (SPM image) of the concavity and convexity shape was obtained. Next, a flattening process including primary inclination correction was performed on the obtained concavity and convexity analysis image, and then two-dimensional fast Fourier transform processing was performed thereon to obtain a Fourier-transformed image. Then, on the basis of the concavity and convexity analysis image and the Fourier-transformed image, the average height of the concavities and convexities, the average pitch of the concavities and convexities, and the pattern of the Fourier-transformed image of each of the diffraction gratings and micro lenses were determined. Note that, for each diffraction grating, average values of the heights and distances of concavities and convexities at 100 points were employed as the average height of the concavities and convexities and the average pitch of the concavities and convexities, while, for each microlens, average values of heights and distances of the concavities and convexities at 10 points were employed as the average height of the concavities and convexities and the average pitch of the concavities and convexities.

In addition, the median (M) of the depth distribution of the concavities and convexities, the average value (m) of the depth distribution, and the kurtosis (k) of each diffraction grating were also determined on the basis of the concavity and convexity analysis image. Note that the median (M) of the depth distribution of the concavities and convexities, the average value (m) of the depth distribution, and the kurtosis (k) were determined by employing the same methods as the above-described methods for measuring the median (M) of the depth distribution of the concavities and convexities of the first concavity and convexity layer, the average value (m) of the depth distribution thereof, and for measuring the kurtosis.

Example 1

Preparation of Master Block (Mold) for Forming Diffraction Grating

A block copolymer solution was obtained by dissolving 150 mg of the block copolymer 1 and 38 mg of polyethylene glycol 4,000 (Mw=3000, Mw/Mn=1.10) manufactured by Tokyo Chemical Industry Co., Ltd., as polyethylene oxide in toluene, which was added thereto with the total amount being 10 g, followed by filtration through a membrane filter having a pore diameter of 0.5 μm. Next, the thus obtained block copolymer solution was applied by spin coating in a film thickness of 200 to 250 nm onto a polyphenylene sulfide film (TORELINA manufactured by Toray Industries, Inc.) serving as a base material. The spin coating was performed at a spin speed of 500 rpm for 10 seconds, and subsequently at 800 rpm for 30 seconds. After that, the thin film applied by the spin coating was dried by being left at room temperature for 10 minutes.

Subsequently, the base material on which the thin film was formed was heated in an oven of 170° C. for 5 hours (first heating step). Concavities and convexities were observed on the surface of the thin film heated as described above, indicating that micro phase separation of the block copolymer constituting the thin film occurred. Note that a cross-section of the thin film was observed with a transmission electron microscope (TEM) (H-7100FA manufactured by Hitachi, Ltd.). The micro phase separation was confirmed also by the image of the cross-section.

Next, PMMA was removed by selective decomposition from the block copolymer layer on the base material by performing the following etching treatment on the thin film subjected to the first heating step. In the decomposition-removal step, first, the thin film was irradiated with ultraviolet rays at an irradiation intensity of 30 J/cm$^2$ by use of a high pressure mercury lamp. Subsequently, the thin film was immersed in acetic acid to remove PMMA by selective decomposition, washed with ion-exchanged water, and then dried. Note that a measurement by a transmission electron microscope (TEM) showed that, from the concavities and convexities generated on the surface of the thin film by the first heat treatment, an apparently deep concavity and convexity pattern was formed on the base material by the decomposition-removal step.

Subsequently, the base material having the concavity and convexity pattern formed by the etching treatment was subjected to a heat treatment (second heating step) in an oven of 140° C. for 1 hour. A thin nickel layer of about 10 nm was formed as a current seed layer by sputtering on a surface of the thin film subjected to the second heating step and having the concavity and convexity pattern formed thereon. Subsequently, the base material having the thin film on which the nickel layer was formed was subjected to an electroforming treatment (maximum current density: 0.05 A/cm$^2$) in a sulfamic acid-nickel bath at a temperature of 50° C., and nickel was deposited to a thickness of 250 µm. Thus, an electroplating layer (metal layer) was formed on the nickel layer (seed layer). The thus formed nickel-electroformed article (one in which the nickel layer as the electroplating layer was stacked on the nickel layer as the seed layer) was mechanically peeled from the base material having the thin film on which the concavity and convexity pattern was formed. Subsequently, the nickel-electroformed article peeled from the base material as described above was immersed in Chemisol 2303 manufactured by The Japan Cee-Bee Chemical Co., Ltd., and washed with stirring at 50° C. for 2 hours. After that, the polymer component attached on the surface of the electroformed article was removed by repeating application of an acrylic UV curable resin onto the nickel-electroformed article, curing of the acrylic UV curable resin, and peeling of the acrylic UV curable resin three times. Thus, a mold for forming a diffraction grating comprising the nickel-electroformed article having concavities and convexities formed on the surface thereof was obtained.

Observation of a cross-section of the thus obtained mold for forming a diffraction grating with a scanning electron microscope (FE-SEM: S4800 manufactured by Hitachi, Ltd.) showed that the concavities and convexities of the nickel-electroformed article were smooth, and each convex portion had a smooth mountain-like shape.

Subsequently, the mold for forming a diffraction grating was immersed in HD-2101TH manufactured by Daikin Chemicals Sales, Ltd. for approximately 1 minute, dried, and then allowed to stand overnight. On the next day, the mold for forming a diffraction grating was immersed in HDTH manufactured by Daikin Chemicals Sales, Ltd., and washed by being subjected to an ultrasonic wave treatment for approximately 1 minute. Thus, a mold-release treatment was performed on the surface of the mold for forming a diffraction grating.

<Preparation of Substrate Equipped with Diffraction Grating>

A fluorine-containing UV curable resin was applied onto a glass substrate (12 mm in length, 20 mm in width, and 0.7 mm in thickness), and was cured by irradiation with ultraviolet rays at 600 mJ/cm$^2$, with the mold for forming a diffraction grating subjected to the mold-release treatment being pressed thereto. After the resin was cured as described above, the mold for forming a diffraction grating was peeled from the cured resin. Thus, the glass substrate was obtained on which a diffraction grating was stacked. Here, the diffraction grating comprised a cured resin film to which the concavity and convexity shape on the surface of the mold for forming a diffraction grating was transferred.

Figure 16:
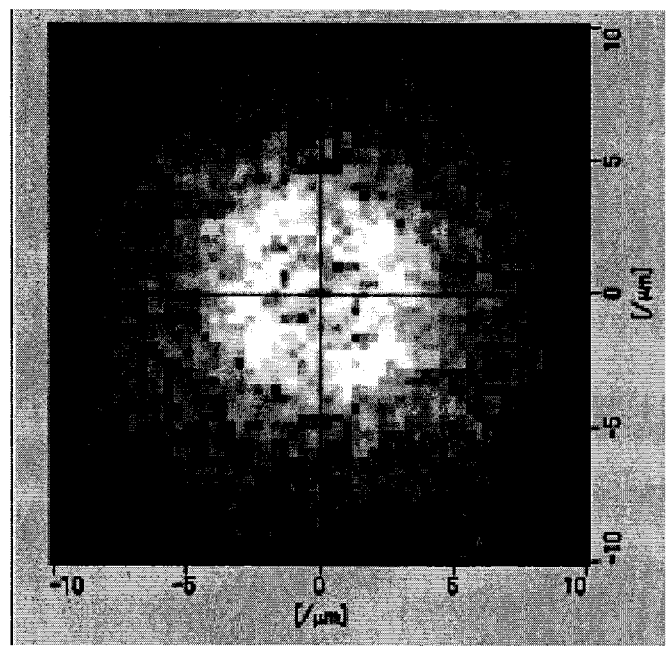
FIG. 16 is a photograph showing a Fourier-transformed image in which a result of two-dimensional fast Fourier transform processing performed on a concavity and convexity analysis image, obtained by using an atomic force microscope, of a surface of a diffraction grating obtained in Example 1 is shown on a display.

FIG. 16 shows a Fourier-transformed image of the thus obtained diffraction grating. As is apparent from the Fourier-transformed image shown in FIG. 16, it was found that the Fourier-transformed image showed a circular pattern substantially centered at an origin at which an absolute value of wavenumber was 0 µm$^{-1}$, and that the annular pattern was such that 90% or more of all the bright spots constituting the Fourier-transformed image were present in a region where an absolute value of wavenumber was within a range of 10 µm$^{-1}$ or less. Moreover, the average height of the concavities and convexities formed on the surface of the diffraction grating was 54 nm, and the average pitch thereof was 605 nm. In addition, the median (M) of the depth distribution of the concavities and convexities was 50.892 nm, the average value (m) of the depth distribution was 47.434 nm, and the kurtosis (k) was −0.973. Note that, on the basis of the concavity and convexity analysis image (SPM image), the ratio of the presence of the above-described "leakage-current prone regions (regions where the shortest distance of the inter-electrode distance was a half or less of the standard distance X based on a calculated distribution of the shortest distance" was determined to be 0%.

<Preparation of Master Block (Mold) for Forming Microlens>

First, a silicone-based polymer (a resin mixture composition of 90% by mass of a silicone rubber [manufactured by Wacker Chemie AG under the product name of "Elastosil RT601A"] and 10% by mass of a curing agent [manufactured by Wacker Chemie AG under the product name of "Elastosil RT601B"]) was applied by a spin coating method onto a polymer film formation substrate (material: glass, thickness: 1.1 mm, size: 17×13 mm) to achieve a thickness of 22.5 µm after the application, and then cured by heating at 100° C. for 1 hour. Thus, a first silicone-based polymer film was formed.

Next, the base material on which the first silicone-based polymer film was formed was placed in a vacuum chamber, and a first aluminum vapor-deposition film (thickness: 100 nm) was formed by a vapor deposition method on the first silicone-based polymer film under conditions of a temperature of 80° C. and a pressure of 1×10$^{-3}$ Pa. Thus, a first laminate was obtained in which the first aluminum vapor-deposition film was formed on the first silicone-based polymer film. Then, the first laminate was cooled in the vacuum chamber to room temperature (25° C.) in 1 hour. After that, the pressure inside the vacuum chamber was returned to atmospheric pressure (1.013×10$^5$ Pa). By cooling the first laminate as described above, concavities and convexities were formed on the surface of the first aluminum vapor-deposition film formed on the first silicone-based polymer film.

Subsequently, a silicone-based polymer (a resin mixture composition of 90% by mass of a silicone rubber [manufactured by Wacker Chemie AG under the product name of "Elastosil RT601A"] and 10% by mass of a curing agent [manufactured by Wacker Chemie AG under the product name of "Elastosil RT601B"]) was applied by a dropping method onto the first aluminum vapor-deposition film to achieve a thickness of 1.5 mm after the application, then cured by heating in an oven at 60° C. for 2 hours, and then detached from the first aluminum vapor-deposition film. Thus, a first mold was obtained.

Next, another base material (material: glass, thickness: 1.1 mm, size: 17×13 mm) was prepared, and an ultraviolet-ray-curable epoxy resin (manufactured by Norland under the product name of "NOA81") was applied by a dropping method onto the base material to achieve a thickness of 100 μm after the application. Thus, a coating film was formed. Then, the ultraviolet-ray-curable epoxy resin was cured by irradiation with ultraviolet rays for 10 minutes, with the first mold being pressed to the surface of the coating film. Subsequently, the first mold was detached. Thus, a first epoxy resin film (second mold) was obtained which had concavities and convexities formed on the surface thereof and originated from the concavity and convexity shape of the first mold.

Subsequently, a silicone-based polymer (a resin mixture composition of 90% by mass of a silicone rubber [manufactured by Wacker Chemie AG under the product name of "Elastosil RT601A"] and 10% by mass of a curing agent [manufactured by Wacker Chemie AG under the product name of "Elastosil RT601B"]) was applied by a dropping method onto the first epoxy resin film to achieve a thickness of 1.5 mm after the application, then cured by heating in an oven at 60° C. for 2 hours, and then detached from the first epoxy resin film. Thus, a second silicone-based polymer film (third mold) was obtained which had concavities and convexities formed on the surface thereof and originated from the concavity and convexity shape of the first epoxy resin film (Note that, as is apparent from the manufacturing methods thereof, the concavity and convexity shape of the first mold was inverted or transferred in each of the first epoxy resin film and the second silicone-based polymer film obtained as described above, and the first epoxy resin film and the second silicone-based polymer film as they are can be used also as master blocks for forming a microlens).

Next, the second silicone-based polymer film was placed in a vacuum chamber, and a second aluminum vapor-deposition film (thickness: 100 nm) was formed by a vapor deposition method under conditions of a temperature of 80° C. and a pressure of $1\times10^{-3}$ Pa on the surface of the second silicone-based polymer film on which the concavities and convexities were formed. Thus, a second laminate was obtained in which the second aluminum vapor-deposition film was formed on the second silicone-based polymer film. Then, the second laminate was cooled in the vacuum chamber to room temperature (25° C.) in 1 hour. After that, the pressure inside the vacuum chamber was returned to atmospheric pressure ($1.013\times10^5$ Pa). By cooling the second laminate as described above, concavities and convexities were formed on the surface of the second aluminum vapor-deposition film formed on the second silicone-based polymer film.

Next, another base material (material: glass, thickness: 1.1 mm, size: 17×13 mm) was prepared, and an ultraviolet-ray-curable epoxy resin (manufactured by Norland under the product name of "NOA81") was applied by a dropping method onto the base material to achieve a thickness of 100 μm after the application. Thus, a coating film was formed. Then, the ultraviolet-ray-curable epoxy resin was cured by irradiation with ultraviolet rays for 10 minutes, with the second laminate being pressed to the surface of the coating film. Subsequently, the second laminate was detached. Thus, a second epoxy resin film (fourth mold) was obtained which had concavities and convexities formed on a surface thereof and originated from the concavity and convexity shape of the second laminate.

Subsequently, a silicone-based polymer (a resin mixture composition of 90% by mass of a silicone rubber [manufactured by Wacker Chemie AG under the product name of "Elastosil RT601A"] and 10% by mass of a curing agent [manufactured by Wacker Chemie AG under the product name of "Elastosil RT601B"]) was applied by a dropping method onto the second epoxy resin film to achieve a thickness of 1.5 mm after the application, then cured by heating in an oven at 60° C. for 2 hours, and then detached from the second epoxy resin film. Thus, a third silicone-based polymer film (fifth mold) was obtained which had concavities and convexities formed thereon and originated from the concavity and convexity shape of the second epoxy resin film.

Next, the third silicone-based polymer film was placed in a vacuum chamber, and a third aluminum vapor-deposition film (thickness: 100 nm) was formed by a vapor deposition method under conditions of a temperature of 80° C. and a pressure of $1\times10^{-3}$ Pa on the surface of the third silicone-based polymer film on which the concavities and convexities were formed. Thus, a third laminate was obtained in which the third aluminum vapor-deposition film was formed on the third silicone-based polymer film. Then, the third laminate was cooled in the vacuum chamber to room temperature (25° C.) in 1 hour. After that, the pressure inside the vacuum chamber was returned to atmospheric pressure ($1.013\times10^5$ Pa). By cooling the third laminate as described above, concavities and convexities were formed on the surface of the third aluminum vapor-deposition film formed on the third silicone-based polymer film.

Subsequently, another base material (material: glass, thickness: 1.1 mm, size: 17×13 mm) was prepared, and an ultraviolet-ray-curable epoxy resin (manufactured by Norland under the product name of "NOA81") was applied by a dropping method onto the base material to achieve a thickness of 100 μm after the application. Thus, a coating film was formed. Then, the ultraviolet-ray-curable epoxy resin was cured by irradiation with ultraviolet rays for 10 minutes, with the third laminate being pressed to the surface of the coating film. Subsequently, the third laminate was detached. Thus, a third epoxy resin film (sixth mold) was obtained which had concavities and convexities formed on a surface thereof and originated from the concavity and convexity shape of the third laminate.

Subsequently, a silicone-based polymer (a resin mixture composition of 90% by mass of a silicone rubber [manufactured by Wacker Chemie AG under the product name of "Elastosil RT601A"] and 10% by mass of a curing agent [manufactured by Wacker Chemie AG under the product name of "Elastosil RT601B"]) was applied by a dropping method onto the third epoxy resin film to achieve a thickness of 1.5 mm after the application, then cured by heating in an oven at 60° C. for 2 hours, and then detached from the third epoxy resin film. Thus, a master block (seventh mold) for forming a microlens was obtained which was made of the silicone-based polymer and which had concavities and convexities formed thereon and originated from the concavity and convexity shape of the third epoxy resin film.

<Preparation of Microlens>

As a supporting material, a resin substrate (TAC film/adhesive layer/PET mold-release film) was prepared in which an adhesive layer having a thickness of 25 nm and being made of an acrylic adhesive agent and a mold-release film made of PET were stacked on one surface of a triacetyl cellulose film (TAC film, 12 mm in length, 20 mm in width) having a thickness of 40 nm.

Then, an ultraviolet-ray-curable epoxy resin (manufactured by Norland under the product name of "NOA81") was applied by a dropping method onto the surface of the TAC film of the resin substrate (supporting material) to achieve a thickness of 10 μm after the application. Thus, a coating film was formed. Then, the ultraviolet-ray-curable epoxy resin was cured by irradiation with ultraviolet rays for 10 minutes, with the master block (seventh mold) for forming a microlens made of the silicone-based polymer being pressed to the surface of the coating film. Subsequently, the master block for forming a microlens was detached. Thus, a resin substrate was obtained on which a microlens made of the cured resin film (thickness: 10 μm) having a concavity and convexity shape was stacked. Here, concavities and convexities originated from the concavity and convexity shape of the master block for forming a microlens were formed on the surface of the cured resin film.

Figure 17:
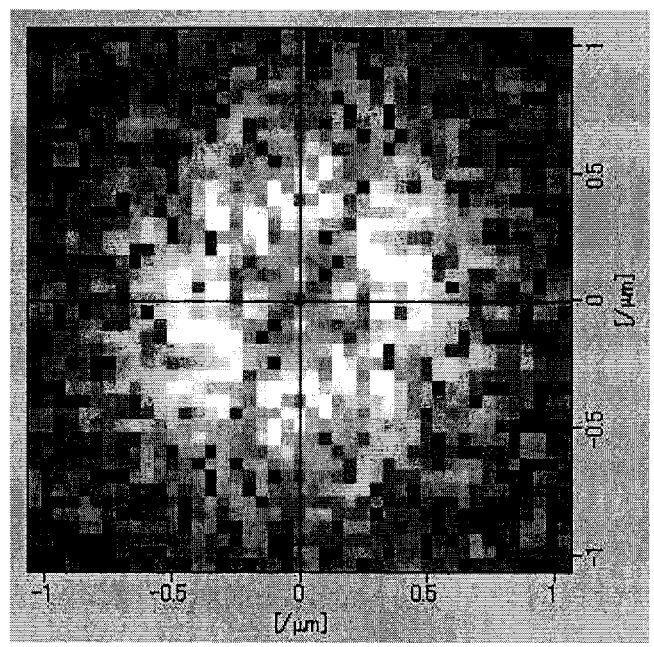
FIG. 17 is a photograph showing a Fourier-transformed image in which a result of two-dimensional fast Fourier transform processing performed on a concavity and convexity analysis image, obtained by using an atomic force microscope, of a surface of a microlens obtained in Example 1 is shown on a display.

FIG. 17 shows a Fourier-transformed image of the thus obtained microlens. As is apparent from the Fourier-transformed image shown in FIG. 17, it was found that the Fourier-transformed image showed a circular pattern substantially centered at an origin at which an absolute value of wavenumber was 0 μm$^{-1}$, and the annular pattern was such that 90% or more of all the bright spots constituting the Fourier-transformed image were present within a region where an absolute value of wavenumber was 1 μm$^{-1}$ or less. In addition, the average height of the concavities and convexities formed on the surface of the microlens was 840 nm, and the average pitch thereof was 3.1 μm.

<Preparation of Organic EL Element>

First, a laminate for an organic EL element was obtained as follows by using the glass substrate obtained as described above on which the diffraction grating was stacked. Specifically, on the surface of the diffraction grating on the glass substrate, a transparent electrode (ITO, thickness: 120 nm), a hole transporting layer (α-NPD, thickness: 30 nm), a light emitting layer (a layer of CBP doped with 7.0 mol % of Ir(ppy)$_3$ complex, thickness: 30 nm), a hole blocking layer (10-phenanthroline (BCP), thickness: 5 nm), an electron transporting layer (aluminum quinolinol complex (Alq$_3$), thickness: 50 nm), a cathode buffer layer (lithium fluoride (LiF), thickness: 1.5 nm), and a metal electrode (aluminum, thickness: 50 nm) were each stacked by a vapor deposition method, while being formed into such a shape that the shape of the concavities and convexities formed on the surface of the diffraction grating (first concavity and convexity layer: cured resin layer) was maintained. Note that, in the laminate, glass substrate/diffraction grating/transparent electrode/hole transporting layer/light emitting layer/hole blocking layer/electron transporting layer/cathode buffer layer/metal electrode were stacked in this order.

Next, the PET mold-release film was peeled from the resin substrate (TAC film/adhesive layer/PET mold-release film) obtained as described above on which the microlens was stacked. The adhesive layer appearing on the surface was laminated on the surface of the glass substrate of the laminate for an organic EL element, and the adhesive layer was cured. Thus, an organic EL element was obtained which had a structure as shown in FIG. 14 (microlens (10 μm)/TAC film (40 nm)/adhesive layer (25 nm)/glass substrate (0.7 mm)/diffraction grating (5 μm)/transparent electrode (120 nm)/hole transporting layer (30 nm)/light emitting layer (30 nm)/hole blocking layer (5 nm)/electron transporting layer (50 nm)/cathode buffer layer (1.5 nm)/metal electrode (50 nm)).

Comparative Example 1

An organic EL element for comparison (microlens/TAC film/adhesive layer/glass substrate/transparent electrode/hole transporting layer/light emitting layer/hole blocking layer/electron transporting layer/cathode buffer layer/metal electrode) was obtained by employing the same method as that of Example 1, except that a glass substrate (12 mm in length, 20 mm in width, and 0.7 mm in thickness) was used instead of the glass substrate on which the diffraction grating was stacked.

Comparative Example 2

An organic EL element for comparison (hemispherical lens/epoxy resin adhesive layer (dropping method)/glass substrate/diffraction grating/transparent electrode/hole transporting layer/light emitting layer/hole blocking layer/electron transporting layer/cathode buffer layer/metal electrode) was obtained by employing the same method as that of Example 1, except for the following point. Specifically, the laminate of the microlens, the TAC film, and the adhesive layer was not stacked on the surface of the glass substrate by using the resin substrate on which the microlens was stacked, but a hemispherical lens having a diameter of 5 mm (manufactured by Edmund) was stacked on the surface of the glass substrate by using an uncured ultraviolet-ray-curable epoxy resin (manufactured by Norland under the product name of "NOA81") as an adhesive agent.

Comparative Example 3

An organic EL element for comparison (hemispherical lens/epoxy resin adhesive layer/glass substrate/transparent electrode/hole transporting layer/light emitting layer/hole blocking layer/electron transporting layer/cathode buffer layer/metal electrode) was obtained by employing the same method as that of Example 1, except for the following points. Specifically, a glass substrate (12 mm in length, 20 mm in width, and 0.7 mm in thickness) was used instead of the glass substrate on which the diffraction grating was stacked. In addition, the laminate of the microlens, the TAC film, and the adhesive layer was not stacked on the surface of the glass substrate by using the resin substrate on which the microlens was stacked, but a hemispherical lens having a diameter of 5 mm (manufactured by Edmund) was stacked on the surface of the glass substrate by using an uncured ultraviolet-ray-curable epoxy resin (manufactured by Norland under the product name of "NOA81") as an adhesive agent.

Comparative Example 4

An organic EL element for comparison (glass substrate/diffraction grating/transparent electrode/hole transporting layer/light emitting layer/hole blocking layer/electron transporting layer/cathode buffer layer/metal electrode) was obtained by employing the same method as that of Example 1, except that the step of stacking the laminate of the microlens, the TAC film, and the adhesive layer on the surface of the glass substrate by use of the resin substrate on which the microlens was stacked was not carried out.

Comparative Example 5

An organic EL element for comparison (glass substrate/transparent electrode/hole transporting layer/light emitting layer/hole blocking layer/electron transporting layer/cathode buffer layer/metal electrode) was obtained by employing the same method as that of Example 1, except that a glass substrate (12 mm in length, 20 mm in width, and 0.7 mm in thickness) was used instead of the glass substrate on which the diffraction grating was stacked, and that the step of stacking the laminate of the microlens, the TAC film, and the adhesive layer on the surface of the glass substrate by use of the resin substrate on which the microlens was stacked was not carried out.

[Performance Evaluations of Organic EL Elements Obtained in Example 1 and Comparative Examples 1 to 5]

(i) Measurement of Light Emission Efficiency

The light emission efficiencies of the organic EL elements obtained in Example 1 and Comparative Examples 1 to 5 were measured by the following method. Specifically, a voltage was applied to an organic EL element, and then the applied voltage (V) and a current (I) flowing through the organic EL element were measured with a measuring instrument (manufactured by ADVANTEST CORPORATION, model No: R6244), and a luminance (L) was measured with a spectrometer (Solid LambdaCCD UV-NIR manufactured by Spectra Co-op). On the basis of the thus obtained measured values of the applied voltage (V), the current (I), and the light emission luminance (L), a current efficiency was calculated by using the following calculation formula (F1), and a power efficiency was calculated by using the following calculation formula (F2):

(Current efficiency)=$(L/I)$ (F1), (Power efficiency)=$(L/I/V)$ (F2).

Then, values (ratios of the current efficiency and the voltage efficiency with respect to those of Comparative Example 5) normalized to reference values (taken as 1) which were the values of the organic EL element obtained in Comparative Example 5 in which neither a microlens nor a diffraction grating was used. Table 1 shows the obtained results.

(ii) Measurement of Capability of Preventing Leakage Current

On the basis of the values of the applied voltage (V), the current (I), and the light emission luminance (L) measured in (i) Measurement of Light Emission Efficiency described above, the presence or absence of generation of a leakage current was evaluated by making a comparison as to the relationship between the current and the luminance at the same voltage. Table 1 shows the obtained results.

(iii) Measurement of Angle-Dependence of Luminance

By using each of the organic EL elements obtained in Example 1 and Comparative Examples 1 to 5, an intensity of an emission spectrum was measured from an integral area of an emission spectrum of light having wavelengths of 450 to 700 nm at each of 33 measurement positions whose measuring angles ranged from −80° to 80° with intervals of 5 degrees, where a direction perpendicular to the glass substrate was defined as a measuring angle of 0°. For the measurement of the intensity of the emission spectrum, a measuring apparatus manufactured by Ocean Optics under the product name of "USB-2000" was used, and a spectrum of light emitted from a randomly selected measuring point on the organic EL element upon application of a voltage of approximately 10 V to the organic EL element was measured. In addition, for the measurement of the intensity of the emission spectrum, the distance between a light-receiving portion for receiving the emission spectrum and the measuring point on the surface of the organic EL element was set to 10 cm.

Then, the measured value of the intensity of the emission spectrum at each measuring angle determined as described above was normalized to the value of an intensity of an emission spectrum measured at a measuring angle of 0°. Thus, a normalized value of the intensity of the emission spectrum (a value obtained by dividing the value measured at each measuring angle by the value measured at a measuring angle of 0°) was found. Then, a calculation was performed according to the inequality:

$$Z = \Sigma(y(\theta) - y_0(\theta))^2$$

[in the formula, $\theta$ represents the above-described 33 measuring angles, $y(\theta)$ represents the normalized values of the intensities of the emission spectra at the angles $\theta$, and $y_0(\theta)$ represents theoretical values, determined from a radiation pattern based on the Lambert law, of intensities of emission spectra at the angles $\theta$]. On the basis of the obtained value of Z, the angle-dependence of luminance was evaluated. Note that a smaller value of Z (the sum of squares of the differences between the normalized values and the theoretical values) indicates that the radiation pattern is closer to the radiation pattern of the Lambert law, and the value of Z can be used as an index of the angle-dependence of luminance. Table 1 shows the obtained results.

(iv) Measurement of Color Coordinate

By employing the same measuring method as the method for measuring an intensity of an emission spectrum employed in (iii) Measurement of Angle-Dependence of Luminance described above, intensities of emission spectra of light having wavelengths of 380 to 780 nm were measured for the organic EL elements obtained in Example 1 and Comparative Examples 1 to 5. On the basis of the data on the intensities of the emission spectra, a u' v' chromaticity diagram (CIE 1976 UCS chromaticity diagram) was obtained. Then, distances (Δc) between the coordinate point in the u' v'chromaticity diagram for a case where the measuring angle $\theta$ was 0° and the coordinate point in the u' v' chromaticity diagram for each measuring angle $\theta$ in the measurement of the intensities of the emission spectra were found, and the maximum value thereof was found (the range of the numeric values of Δc was found). Note that a smaller change in the value of Δc indicates more reduced change in chromaticity. Table 1 shows the obtained results.

TABLE 1

| | Structure of element | | | | | Angle- | | |
| --- | --- | --- | --- | --- | --- | --- | --- | --- |
| | Diffraction grating | Microlens | Overall thickness (μm) | Current efficiency | Voltage efficiency | dependence of luminance (z value) | Angle-dependence of chromaticity (Condition of Δc) | Presence or absence of leakage current |
| Example 1 | Concavity and convexity resin film | Concavity and convexity resin film | 1500 | 1.61 | 1.99 | 0.013 | Δc < 0.006 | Absent |

TABLE 1-continued

| | Structure of element | | | | Angle- | | |
| --- | --- | --- | --- | --- | --- | --- | --- |
| | Diffraction grating | Microlens | Overall thickness (μm) | Current efficiency | Voltage efficiency | dependence of luminance (z value) | Angle-dependence of chromaticity (Condition of Δc) | Presence or absence of leakage current |
| Comp. Ex. 1 | None | Concavity and convexity resin film | 1500 | 1.21 | 1.17 | 0.016 | Δc < 0.003 | Absent |
| Comp. Ex. 2 | Concavity and convexity resin film | Hemispherical lens | 5400 | 2.48 | 3.34 | 0.878 | Δc < 0.025 | Absent |
| Comp. Ex. 3 | None | Hemispherical lens | 5400 | 1.68 | 1.85 | 0.780 | Δc < 0.025 | Absent |
| Comp. Ex. 4 | Concavity and convexity resin film | None | 1400 | 1.45 | 1.74 | 0.028 | Δc < 0.012 | Absent |
| Comp. Ex. 5 | None | None | 1400 | 1.00 | 1.00 | 0.026 | Δc < 0.012 | Absent |

As is apparent from the results shown in Table 1, it was found that the organic EL element (Example 1) of the present invention comprising the light extraction transparent substrate for an organic EL element of the present invention had sufficiently higher current and voltage efficiencies, a higher light emission efficiency, and a sufficiently higher level of extraction efficiency of light to the outside than the organic EL element obtained in Comparative Example 5 in which the glass substrate was used as the light-extraction surface, and neither a diffraction grating nor a microlens was used. In addition, it was found that although the organic EL elements obtained in Comparative Examples 2 and 3 in which the hemispherical lens was used as a microlens had very high values of the current efficiency and the voltage efficiency, the angle-dependence of luminance and the angle-dependence of chromaticity were large, and hence it can be said that these organic EL elements were not necessarily sufficient in a practical sense. On the other hand, it can be understood that the organic EL element (Example 1) of the present invention showed a radiation pattern close to that based on the Lambert law, because the angle-dependence of luminance was low, and it was found that the angle-dependence of light emission was sufficiently reduced in the organic EL element of the present invention. Moreover, the thickness of the element structure of the organic EL element (Example 1) of the present invention can be sufficiently smaller than those of the organic EL elements obtained in Comparative Examples 2 and 3. Also from such a viewpoint, it can be said that the organic EL element (Example 1) of the present invention is highly practical. Furthermore, as is apparent from the fact that the value of Δc was less than 0.006 at any measuring angle, it was found that the angle-dependence of chromaticity of the organic EL element (Example 1) of the present invention was remarkably reduced, and the change in chromaticity thereof was remarkably reduced. In addition, it can be understood that the organic EL element for comparison (Comparative Example 1) in which no diffraction grating was used, but only a microlens comprising a cured resin film having concavities and convexities formed thereon was highly practical, because the improvement in light emission efficiency, reduction of the angle-dependence of luminance, and the reduction of the angle-dependence of chromaticity were achieved in a well-balanced manner. However, it can be understood that the organic EL element for comparison (Comparative Example 1) was not necessarily sufficient in terms of light emission efficiency, when compared with the organic EL element (Example 1) of the present invention. In addition, the organic EL element for comparison (Comparative Example 4) in which no microlens was used, but only the diffraction grating was used achieved the improvement in light emission efficiency, the reduction of the angle-dependence of luminance, and the reduction of the angle-dependence of chromaticity in a well-balanced manner. However, it can be understood that the organic EL element for comparison (Comparative Example 4) was not necessarily sufficient in terms of the reduction of the angle-dependence of luminance and the reduction of the angle-dependence of chromaticity, when compared with the organic EL element (Example 1) of the present invention. From these results, it was found that the improvement in light emission efficiency, the reduction of the angle-dependence of luminance, and the reduction of the angle-dependence of chromaticity were exhibited at extremely high levels in a well-balanced manner when the light extraction transparent substrate for an organic EL element (Example 1) of the present invention was used which comprised: the diffraction grating being located on one surface of the transparent supporting substrate and having the first concavities and convexities formed thereon; and the microlens being located on another surface and having the second concavities and convexities formed thereon, wherein the shape of the first concavities and convexities and the shape of the second concavities and convexities were each such that when a Fourier-transformed image was obtained by performing two-dimensional fast Fourier transform processing on a concavity and convexity analysis image obtained by analyzing the shape of the concavities and convexities by use of an atomic force microscope, the Fourier-transformed image showed a circular or annular pattern substantially centered at an origin at which an absolute value of wavenumber is 0 μm$^{-1}$.

Reference Example 1

Preparation of Master Block for Forming Diffraction Grating

First, a mold comprising a nickel-electroformed article whose surface was subjected to a mold-release treatment (hereinafter, simply referred to as mold (A)) was obtained by employing the same method as the method for preparing a master block (mold) for forming a diffraction grating employed in Example 1. Next, a mold (B) for forming a diffraction grating was manufactured by using the thus obtained mold (A). Specifically, a fluorine-containing UV curable resin (manufactured by Asahi Glass Co., Ltd. under the product name of "NIF") was applied onto a PET substrate (COSMOSHINE A-4100 manufactured by Toyobo Co., Ltd.), and the mold (A) comprising the nickel-electroformed article was pressed thereto. Then, the fluorine-containing UV curable resin was cured by irradiation with ultraviolet rays at 600 mJ/cm², and then the mold (A) was peeled off. Thus, the mold (B) for forming a diffraction grating which was made of the UV curable resin film to which the surface shape of the mold (A) was transferred was obtained. The thickness of the UV curable resin to which the surface shape was transferred was 1 μm.

<Formation of Diffraction Grating>

First, 2.5 g of tetraethoxysilane (TEOS) and 2.1 g of methyltriethoxysilane (MTES) were added dropwise to a liquid obtained by mixing 24.3 g of ethanol, 2.16 g of water, and 0.0094 g of concentrated hydrochloric acid, and the mixture was stirred at 23° C. and at a humidity of 45% for 2 hours. Thus, a sol was obtained. Subsequently, the sol was applied onto a glass substrate having a thickness of 0.7 mm (made from soda lime) with a bar coater. Thus, a coating film of the sol was formed on the glass substrate. Then, 60 seconds after the formation of the coating film, the mold (B) manufactured in Example 1 was pressed to the coating film on the glass substrate by using a heated pressing roll, and by employing a method shown below. Thus, a diffraction grating (a concavity and convexity layer) was formed on the glass substrate.

Specifically, first, the pressing roll used had a heater therein and an outer periphery covered with a heat-resistant silicone having a thickness of 4 mm. The roll diameter was 50 mm, and the length of the roll in the axial direction was 350 mm. Then, the surface of the mold (B) on which the concavity and convexity pattern was formed was pressed to the coating film on the glass substrate, while the pressing roll heated at 80° C. was rotated from one end to the other end of the glass substrate. After completion of the pressing of the mold (B) as described above, the mold (B) was peeled from the one end to the other end at a peeling angle of approximately 30° by hand. Then, after the mold (B) was peeled, a glass substrate provided with a cured coating film having concavities and convexities formed thereon and originated from the concavities and convexities of the mold (B) was heated at 300° C. for 60 minutes by using an oven. Thus, the glass substrate on which a diffraction grating (concavity and convexity layer) made of an inorganic layer was stacked was obtained. Note that the thickness of the inorganic layer was 0.3 μm.

It was found that a Fourier-transformed image of the thus obtained diffraction grating (inorganic layer) showed a circular pattern substantially centered at an origin at which an absolute value of wavenumber was 0 μm$^{-1}$, and the circular pattern was such that 90% or more of all the bright spots constituting the Fourier-transformed image were present within a region where an absolute value of wavenumber was within a range of 10 μm$^{-1}$ or less. In addition, the average height of the concavities and convexities formed on the surface of the diffraction grating was 71.5 nm, and the average pitch thereof was 375 nm. In addition, the median (M) of the depth distribution of the concavities and convexities was 49.6 nm, the average value (m) of the depth distribution thereof was 50.3 nm, the standard deviation (σ) of the distribution of the depths of the concavities and convexities was 19.3 nm, and the kurtosis (k) was −0.15.

INDUSTRIAL APPLICABILITY

As described above, the present invention makes it possible to provide a light extraction transparent substrate for an organic EL element, the light extraction transparent substrate being capable of sufficiently improving the light extraction efficiency of an organic EL element, sufficiently reducing the change in chromaticity, and sufficiently reducing the angle-dependence of luminance. The pre sent invention also makes it possible to provide an organic EL element using the same.

Hence, the light extraction transparent substrate for an organic EL element of the present invention is extremely useful as a transparent substrate for an organic EL element used for white illumination and the like, etc.

REFERENCE SIGNS LIST

1: light extraction transparent substrate
10: transparent supporting substrate
10A: incident surface of transparent supporting substrate of light of organic EL element
10B: emitting surface of transparent supporting substrate of light of organic EL element
11: diffraction grating (first concavity and convexity layer)
11': diffraction grating formation material
12: microlens (second concavity and convexity layer)
13: adhesive layer
14: transparent resin layer
21: concavity and convexity layer made of first polymer segment
22: seed layer
23: metal layer (electroplating layer)
30: transfer master member
31: master block (mold) for forming diffraction grating
40: substrate for forming polymer film
41: polymer film
42: vapor-deposition film
43: master block (mold) for forming microlens
43': master block material
51: transparent electrode
52: organic layer
53: cathode buffer layer
54: metal electrode
101: hole transporting layer
102: light emitting layer
103: hole blocking layer
104: electron transporting layer
L: arrow conceptually indicating direction in which light of organic EL element travels
O: light-receiving portion of emission spectrum measuring apparatus
S: surface of second concavity and convexity layer
P: randomly selected measuring point on surface of second concavity and convexity layer
L1: line segment connecting point P and point O
A: arrow conceptually indicating direction perpendicular to surface of second concavity and convexity layer
X: inter-electrode distance (standard distance) between transparent electrode and metal electrode
Y: distance (the shortest distance) which is the shortest inter-electrode distance between the transparent electrode and the metal electrode

The invention claimed is:

1. A light extraction transparent substrate for an organic EL element, which is used by being disposed on an emitting surface side of light in the organic EL element, the light extraction transparent substrate comprising:
   a transparent supporting substrate;
   a diffraction grating which comprises a first concavity and convexity layer having first concavities and convexities formed on a surface thereof and which is located on a surface of the transparent supporting substrate, the surface of the transparent supporting substrate serving as an incident surface of the light of the organic EL element when the transparent supporting substrate is used in the organic EL element; and a microlens which comprises a second concavity and convexity layer having second concavities and convexities formed on a surface thereof and which is located on a surface of the transparent supporting substrate, the surface of the transparent supporting substrate serving as an emitting surface of the light of the organic EL element when the transparent supporting substrate is used in the organic EL element, wherein a shape of the first concavities and convexities and a shape of the second concavities and convexities are each such that when a Fourier-transformed image is obtained by performing two-dimensional fast Fourier transform processing on a concavity and convexity analysis image obtained by analyzing the shape of their concavities and convexities by use of an atomic force microscope, the Fourier-transformed image shows a circular or annular pattern substantially centered at an origin at which an absolute value of wavenumber is 0 µm$^{-1}$.

2. The light extraction transparent substrate for an organic EL element according to claim 1, wherein
the circular or annular pattern of the Fourier-transformed image of the shape of the first concavities and convexities is present within a region where an absolute value of wavenumber is within a range of 10 µm$^{-1}$ or less, and
the circular or annular pattern of the Fourier-transformed image of the shape of the second concavities and convexities is present within a region where an absolute value of wavenumber is within a range of 1 µm$^{-1}$ or less.

3. The light extraction transparent substrate for an organic EL element according to claim 1, wherein
the first concavities and convexities have an average height of 30 to 100 nm and an average pitch of 10 to 700 nm, and
the second concavities and convexities have an average height of 400 to 1000 nm and an average pitch of 2 to 10 µm.

4. The light extraction transparent substrate for an organic EL element according to claim 1, wherein
an average value and a median of a depth distribution of the first concavities and convexities satisfy a condition represented by the following inequality (1):

$$0.95 \times Y \leq M \leq 1.05 \times Y \quad (1),$$

wherein in the inequality (1), Y represents a value obtained by calculation according to a formula: Y=1.07 m−2.25 (in the formula, m represents the average value of the depth distribution of the first concavities and convexities, which has a numeric value of 20 to 100 nm), and M represents the median of the depth distribution of the first concavities and convexities.

5. The light extraction transparent substrate for an organic EL element according to claim 1, wherein
a kurtosis of the first concavities and convexities has a value of −1.2 or greater.

6. The light extraction transparent substrate for an organic EL element according to claim 1, wherein a kurtosis of the first concavities and convexities has a value within a range from −1.2 to 1.2.

7. The light extraction transparent substrate for an organic EL element according to claim 1, wherein
when intensities of emission spectra are measured for a randomly selected measuring point on the surface of the second concavity and convexity layer on which surface the second concavities and convexities are formed,
where light incident on the light extraction transparent substrate on the first concavity and convexity layer side exits from the light extraction transparent substrate on the second concavity and convexity layer side,
a condition represented by the following inequality (2) is satisfied:

$$\Sigma(y(\theta)-y_0(\theta))^2 \leq 0.05 \quad (2),$$

wherein in the formula, θ represents 33 measuring angles ranging from −80° to 80° with intervals of 5°, y(θ) represents values obtained by normalizing values of intensities of emission spectra measured at angles θ with respect to a value of an intensity of an emission spectrum measured at an angle of 0°, and $y_0(\theta)$ represents values obtained by normalizing theoretical values, determined from a radiation pattern based on the Lambert law, of intensities of emission spectra at the angles θ with respect to a theoretical value, determined from the radiation pattern, of an intensity of an emission spectrum at an angle of 0°.

8. The light extraction transparent substrate for an organic EL element according to claim 1, wherein
the second concavity and convexity layer is stacked on the transparent supporting substrate with a pressure-sensitive adhesive layer and/or an adhesive layer interposed therebetween.

9. The light extraction transparent substrate for an organic EL element according to claim 1, wherein
a protective layer is stacked on the surface of the second concavity and convexity layer on which surface the shape of the concavities and convexities is formed.

10. An organic EL element, comprising:
a transparent supporting substrate;
a diffraction grating comprising a first concavity and convexity layer which is disposed on one surface of the transparent supporting substrate and which has first concavities and convexities formed on a surface thereof;
a microlens comprising a second concavity and convexity layer which is disposed on another surface of the transparent supporting substrate and which has second concavities and convexities formed on a surface thereof; and
a transparent electrode, an organic layer, and a metal electrode, which are stacked in this order on the first concavity and convexity layer, while being formed into such shapes that a shape of the first concavities and convexities formed on the surface of the first concavity and convexity layer is maintained, wherein
a constituent unit formed by the transparent supporting substrate, the diffraction grating, and the microlens comprises the light extraction transparent substrate for an organic EL element according to claim 1.

* * * * *